US012382626B2

(12) United States Patent
Oh et al.

(10) Patent No.: US 12,382,626 B2
(45) Date of Patent: Aug. 5, 2025

(54) SEMICONDUCTOR MEMORY DEVICE, METHOD FOR FABRICATING THE SAME AND ELECTRONIC SYSTEM INCLUDING THE SAME

(71) Applicant: SAMSUNG ELECTRONICS CO., LTD., Suwon-si (KR)

(72) Inventors: Min Jae Oh, Hwaseong-si (KR); Ik Soo Kim, Yongin-si (KR); Sang Ho Rha, Seongnam-si (KR); Ji Woon Im, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 533 days.

(21) Appl. No.: 17/828,580

(22) Filed: May 31, 2022

(65) Prior Publication Data

US 2023/0146542 A1  May 11, 2023

(30) Foreign Application Priority Data

Nov. 9, 2021 (KR) ........................ 10-2021-0153001

(51) Int. Cl.
H10B 12/00 (2023.01)
(52) U.S. Cl.
CPC ........... *H10B 12/312* (2023.02); *H10B 12/09* (2023.02); *H10B 12/482* (2023.02)
(58) Field of Classification Search
None
See application file for complete search history.

(56) References Cited

U.S. PATENT DOCUMENTS

| 9,683,503 B2 | 6/2017 | Zhang et al. |
| 10,566,345 B2 | 2/2020 | Kanamori et al. |
| 11,037,950 B2 | 6/2021 | Baek |
| 11,211,402 B2 | 12/2021 | Kanamori et al. |
| 2005/0136686 A1 | 6/2005 | Kim et al. |
| 2017/0301684 A1* | 10/2017 | Park ........................ H10B 43/30 |
| 2018/0026047 A1* | 1/2018 | Park ........................ H10B 43/50 257/314 |

(Continued)

FOREIGN PATENT DOCUMENTS

| KR | 20050060837 A | 6/2005 |
| KR | 100555539 B1 | 3/2006 |

(Continued)

*Primary Examiner* — Sue A Purvis
*Assistant Examiner* — Jordan M Klein
(74) *Attorney, Agent, or Firm* — Myers Bigel, P.A.

(57) ABSTRACT

A semiconductor memory device includes a cell substrate, a mold structure including a plurality of gate electrodes stacked on the cell substrate, the gate electrodes including a first ground selection line, a second ground selection line and a plurality of word lines, which are sequentially stacked, a channel structure that extends in a vertical direction that crosses an upper surface of the cell substrate and penetrates the mold structure, a partial isolation region that extends in a first direction that is parallel with the upper surface of the cell substrate and partially separates the mold structure, and a ground isolation structure that connects two partial isolation regions adjacent to each other in the first direction, extends in the vertical direction and penetrates the first ground selection line and the second ground selection line, wherein a width of the ground isolation structure increases with distance from the cell substrate.

20 Claims, 33 Drawing Sheets

(56) References Cited

U.S. PATENT DOCUMENTS

| | | | |
|---|---|---|---|
| 2020/0020702 A1* | 1/2020 | Baek | H10D 64/035 |
| 2020/0111803 A1 | 4/2020 | Baek et al. | |
| 2021/0265389 A1* | 8/2021 | Kim | H10B 41/10 |
| 2021/0384213 A1 | 12/2021 | Park et al. | |
| 2023/0023911 A1* | 1/2023 | Lee | H10B 41/35 |

FOREIGN PATENT DOCUMENTS

| | | |
|---|---|---|
| KR | 20170119158 A | 10/2017 |
| KR | 20180010368 A | 1/2018 |
| KR | 20190051651 A | 5/2019 |
| KR | 20200040351 A | 4/2020 |
| KR | 20210032920 A | 3/2021 |
| KR | 20210124836 A | 10/2021 |

* cited by examiner

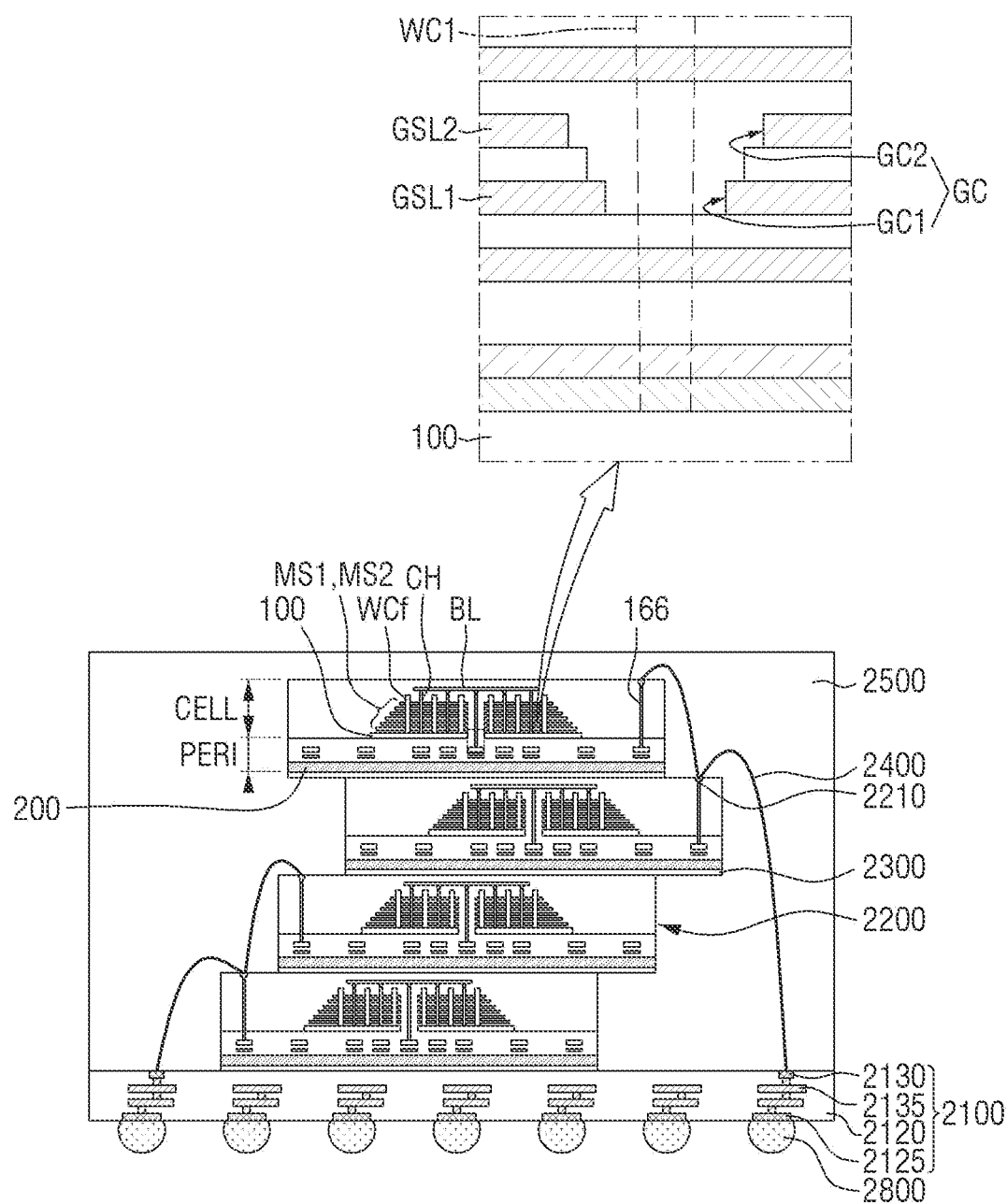

SEMICONDUCTOR MEMORY DEVICE, METHOD FOR FABRICATING THE SAME AND ELECTRONIC SYSTEM INCLUDING THE SAME

CROSS-REFERENCE TO RELATED APPLICATION

This application claims priority from Korean Patent Application No. 10-2021-0153001 filed on Nov. 9, 2021 in the Korean Intellectual Property Office and all the benefits accruing therefrom under 35 U.S.C. 119, the contents of which in its entirety are herein incorporated by reference.

BACKGROUND

The present disclosure relates to a semiconductor memory device, a method for fabricating the same and an electronic system including the same. More particularly, the present disclosure relates to a three-dimensional semiconductor memory device comprising memory cells arranged three-dimensionally, a method for fabricating the same and an electronic system including the same.

The degree of integration of a semiconductor memory device has been increasing in order to fulfil excellent performance and low cost, as desired by consumers. In case of the semiconductor memory device, since the degree of integration is an important factor that determines the price of a product, the increased degree of integration has been especially required.

In case of a two-dimensional or planar semiconductor memory device, since the degree of integration is mainly determined by an area occupied by a unit memory cell, it is greatly affected by the level of the technology for forming a fine pattern. However, since ultra-high-priced equipment may be needed for the fine pattern, the degree of integration of the two-dimensional semiconductor device is increasing but is still restrictive. Therefore, three-dimensional semiconductor devices comprising memory cells that are arranged three-dimensionally have been proposed.

SUMMARY

An object of the present disclosure is to provide a semiconductor memory device that has improved yield by reducing process difficulty and defects.

Another object of the present disclosure is to provide a method for fabricating a semiconductor memory device, which has improved yield by reducing process difficulty and defects.

Other object of the present disclosure is to provide an electronic system that includes a semiconductor memory device, which has improved yield by reducing process difficulty and defects.

The objects of the present disclosure are not limited to those mentioned above and additional objects of the present disclosure, which are not mentioned herein, will be clearly understood by those skilled in the art from the following description of the present disclosure.

According to some embodiments of the present inventive concept, there is provided a semiconductor memory device including a cell substrate, a mold structure including a plurality of gate electrodes stacked on the cell substrate, the gate electrodes including a first ground selection line, a second ground selection line and a plurality of word lines, which are sequentially stacked, a channel structure extended in a vertical direction that intersects an upper surface of the cell substrate and penetrates the mold structure, a partial isolation region that extends in a first direction that is parallel with the upper surface of the cell substrate and partially separates the mold structure, and a ground isolation structure that connects two partial isolation regions adjacent to each other in the first direction, extends in the vertical direction and penetrates the first ground selection line and the second ground selection line, wherein a width of the ground isolation structure increases with distance from the cell substrate.

According to some embodiments of the present inventive concept, there is provided a semiconductor memory device including a cell substrate, a mold structure including mold insulating layers and gate electrodes, which are alternately stacked on the cell substrate, the gate electrodes including a first ground selection line, a second ground selection line, a plurality of word lines and a string selection line, which are sequentially stacked, a channel structure that intersects the respective gate electrodes that penetrates the mold structure, a partial isolation region that extends in a first direction that is parallel with an upper surface of the cell substrate and partially separate the mold structure, and a bit line that extends in a second direction, which is parallel with the upper surface of the cell substrate and intersects the first direction, and connects to the channel structure, wherein the mold structure includes a first cell block and a second cell block, which are separated from each other by the partial isolation region, and a bridge region that connects the first cell block with the second cell block, the first ground selection line includes a first cutting opening formed as which the bridge region of the first ground selection line was removed, the second ground selection line includes a second cutting opening formed as the bridge region of the second ground selection line was removed, and a size of the second cutting opening is greater than a size of the first cutting opening.

According to some embodiments of the present inventive concept, there is provided an electronic system including a main board, a semiconductor memory device on the main board, and a controller electrically connected with the semiconductor memory device on the main board, wherein the semiconductor memory device includes a cell substrate, a mold structure including a plurality of gate electrodes stacked on the cell substrate and respectively connected with the controller, a channel structure that extends in a vertical direction that intersects an upper surface of the cell substrate and penetrates the mold structure, a partial isolation region that extends in a first direction and partially separate the mold structure, and a bit line that extends in a second direction that intersects the first direction, and connects the channel structure with the controller, wherein the mold structure includes a first cell block and a second cell block, which are separated from each other by the partial isolation region, and a bridge region that connects the first cell block with the second cell block, wherein the gate electrodes include a first ground selection line, a second ground selection line and a plurality of word lines, which are sequentially stacked, wherein the first ground selection line includes a first cutting opening that was formed when the bridge region of the first ground selection line was removed, and wherein the second ground selection line includes a second cutting opening that was formed when the bridge region of the second ground selection line was removed, a size of the second cutting opening is greater than a size of the first cutting opening.

BRIEF DESCRIPTION OF THE DRAWINGS

The above and other aspects and features of the present inventive concept will become more apparent by describing in detail example embodiments thereof with reference to the attached drawings, in which:

FIG. 43 is a schematic cross-sectional view taken along line I-I of FIG. 42.

DETAILED DESCRIPTION

Hereinafter, a semiconductor memory device according to example embodiments of the present disclosure will be described with reference to FIGS. 1 to 12.

Figure 1:
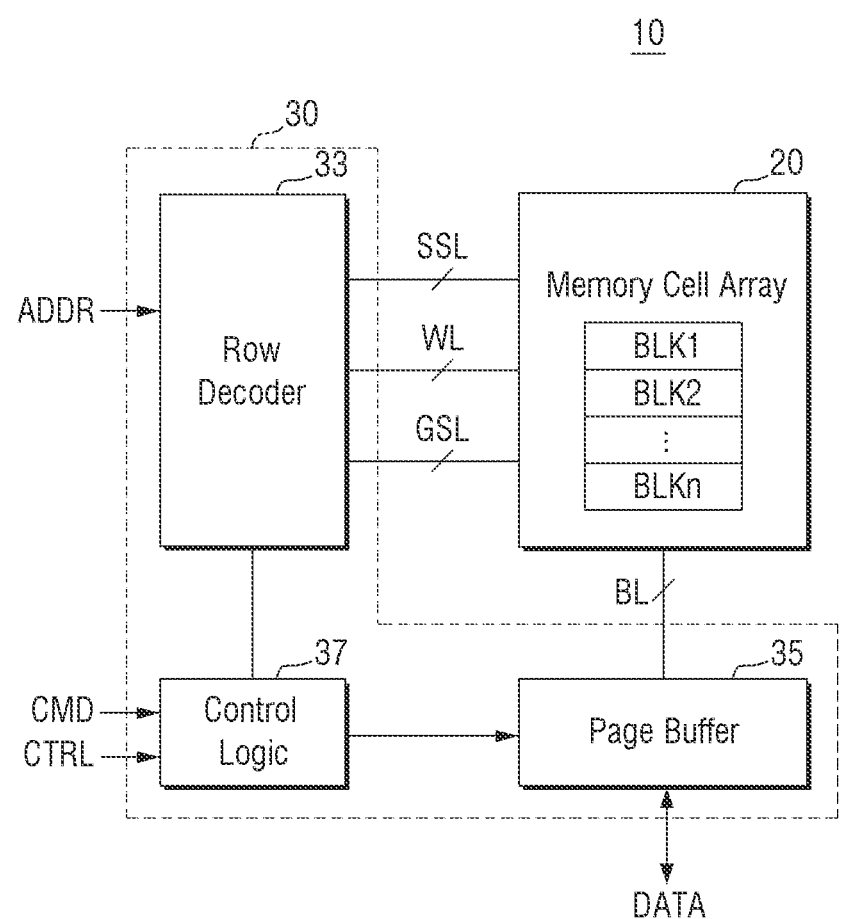
FIG. 1 is an example block view illustrating a semiconductor memory device according to some embodiments of the present disclosure.

FIG. 1 is an example block view illustrating a semiconductor memory device according to some embodiments of the present disclosure.

Referring to FIG. 1, a semiconductor memory device 10 includes a memory cell array 20 and a peripheral circuit 30.

The memory cell array 20 may include a plurality of memory cell blocks BLK1 to BLKn. Each of the memory cell blocks BLK1 to BLKn may include a plurality of memory cells. The memory cell array 20 may be connected to the peripheral circuit 30 through a bit line BL, a word line WL, at least one string selection line SSL and at least one ground selection line GSL. In detail, the memory cell blocks BLK1 to BLKn may be connected to a row decoder 33 through the word line WL, the string selection line SSL and the ground selection line GSL. In addition, the memory cell blocks BLK1 to BLKn may be connected to a page buffer 35 through the bit line BL.

The peripheral circuit 30 may receive an address ADDR, a command CMD and a control signal CTRL from the outside of the semiconductor memory device 10, and may transmit and receive data to and from an external device of the semiconductor memory device 10. The peripheral circuit 30 may include a control logic 37, the row decoder 33 and the page buffer 35. Although not shown, the peripheral circuit 30 may further include various sub-circuits such as an input/output circuit, a voltage generating circuit for generating various voltages required for the operation of the semiconductor memory device 10 and an error correction circuit for correcting an error of data DATA read from the memory cell array 20.

The control logic 37 may be connected to the row decoder 33, the input/output circuit and the voltage generating circuit. The control logic 37 may control the overall operation of the semiconductor memory device 10. The control logic 37 may generate various internal control signals used in the semiconductor memory device 10 in response to the control signal CTRL. For example, the control logic 37 may adjust a voltage level provided to the word line WL and the bit line BL when a memory operation such as a program operation or an erase operation is performed.

The row decoder 33 may select at least one of the plurality of memory cell blocks BLK1 to BLKn in response to the address ADDR, and may select at least one word line WL, at least one string selection line SSL and at least one ground selection line GSL of the selected memory cell blocks BLK1 to BLKn. The row decoder 33 may transmit a voltage for performing a memory operation to the word line WL of the selected memory cell blocks BLK1 to BLKn.

The page buffer 35 may be connected to the memory cell array 20 through the bit line BL. The page buffer 35 may operate as a write driver or a sense amplifier. In detail, when a program operation is performed, the page buffer 35 may operate as a write driver to apply a voltage according to the data DATA to be stored in the memory cell array 20, to the bit line BL. Meanwhile, when a read operation is performed, the page buffer 35 may operate as a sense amplifier to sense the data DATA stored in the memory cell array 20.

Figure 2:
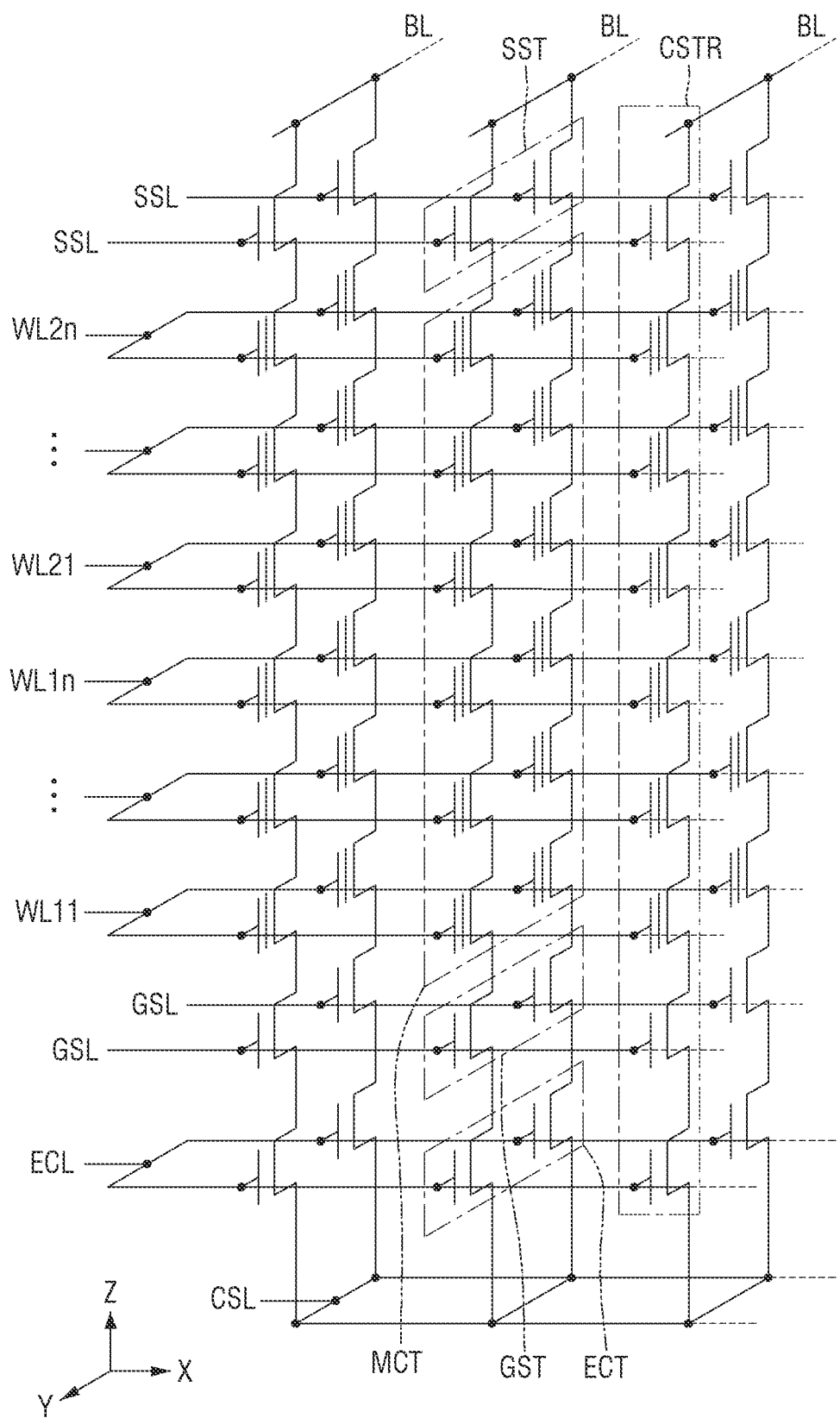
FIG. 2 is an example circuit view illustrating a semiconductor memory device according to some embodiments.

FIG. 2 is an example circuit view illustrating a semiconductor memory device according to some embodiments.

Referring to FIG. 2, a memory cell array (e.g., 20 of FIG. 1) of a semiconductor memory device according to some embodiments includes a common source line CSL, a plurality of bit lines BL and a plurality of cell strings CSTR.

The common source line CSL may be extended in a first direction X. In some embodiments, a plurality of common source lines CSL may be arranged two dimensionally. For example, the plurality of common source lines CSL may be spaced apart from each other and extended in the first direction X. Voltages that are electrically the same may be applied to the common source lines CSL, or different voltages may be applied to the common source lines CSL so that the common source lines CSL may be separately controlled.

The plurality of bit lines BL may be arranged two-dimensionally. For example, the bit lines BL may be spaced apart from each other and extended in a second direction Y crossing or intersecting the first direction X. The plurality of cell strings CSTR may be connected to the respective bit lines BL in parallel. The cell strings CSTR may be commonly connected to the common source line CSL. That is, the plurality of cell strings CSTR may be disposed between the bit lines BL and the common source line CSL.

Each of the cell strings CSTR may include a ground selection transistor GST connected to the common source line CSL, a string selection transistor SST connected to the bit line BL, and a plurality of memory cell transistors MCT disposed between the ground selection transistor GST and the string selection transistor SST. Each of the memory cell transistors MCT may include a data storage element. The ground selection transistor GST, the string selection transistor SST and the memory cell transistors MCT may be connected in series.

The common source line CSL may be commonly connected to sources of the ground selection transistors GST. In addition, the ground selection line GSL, a plurality of word lines WL11 to WL1n and WL21 to WL2n and the string selection line SSL may be disposed between the common source line CSL and the bit line BL. The ground selection line GSL may be used as a gate electrode of the ground selection transistor GST, and the word lines WL11 to WL1n and WL21 to WL2n may be used as gate electrodes of the memory cell transistors MCT, and the string selection line SSL may be used as a gate electrode of the string selection transistor SST.

In some embodiments, an erase control transistor ECT may be disposed between the common source line CSL and the ground selection transistor GST. The common source line CSL may be commonly connected to sources of the erase control transistors ECT. An erase control line ECL may be disposed between the common source line CSL and the ground selection line GSL. The erase control line ECL may be used as a gate electrode of the erase control transistor ECT. The erase control transistors ECT may generate a gate induced drain leakage (GIDL) to perform an erase operation of the memory cell array.

Figure 3:
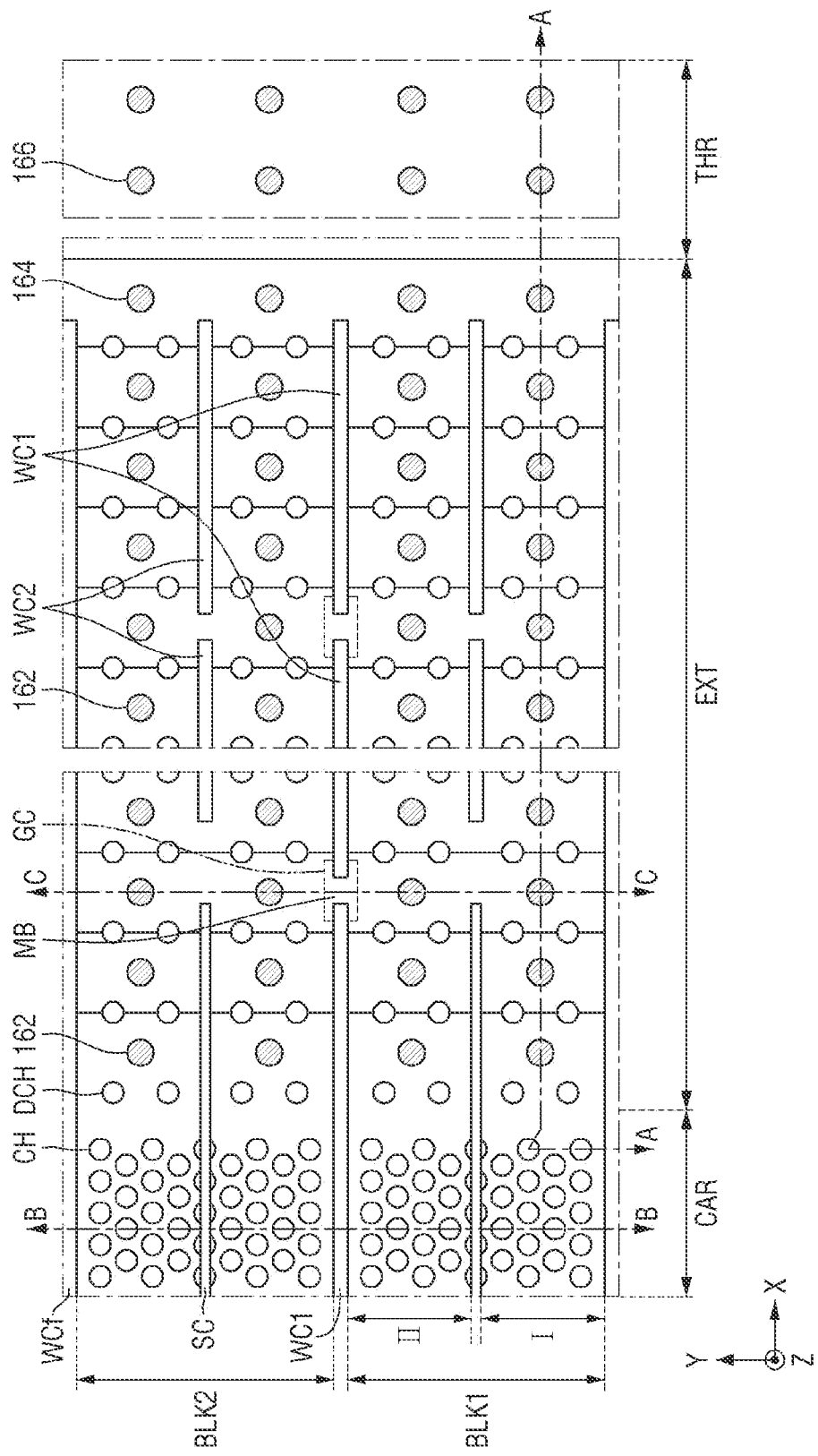
FIG. 3 is an example layout view illustrating a semiconductor memory device according to some embodiments.
Figure 4:
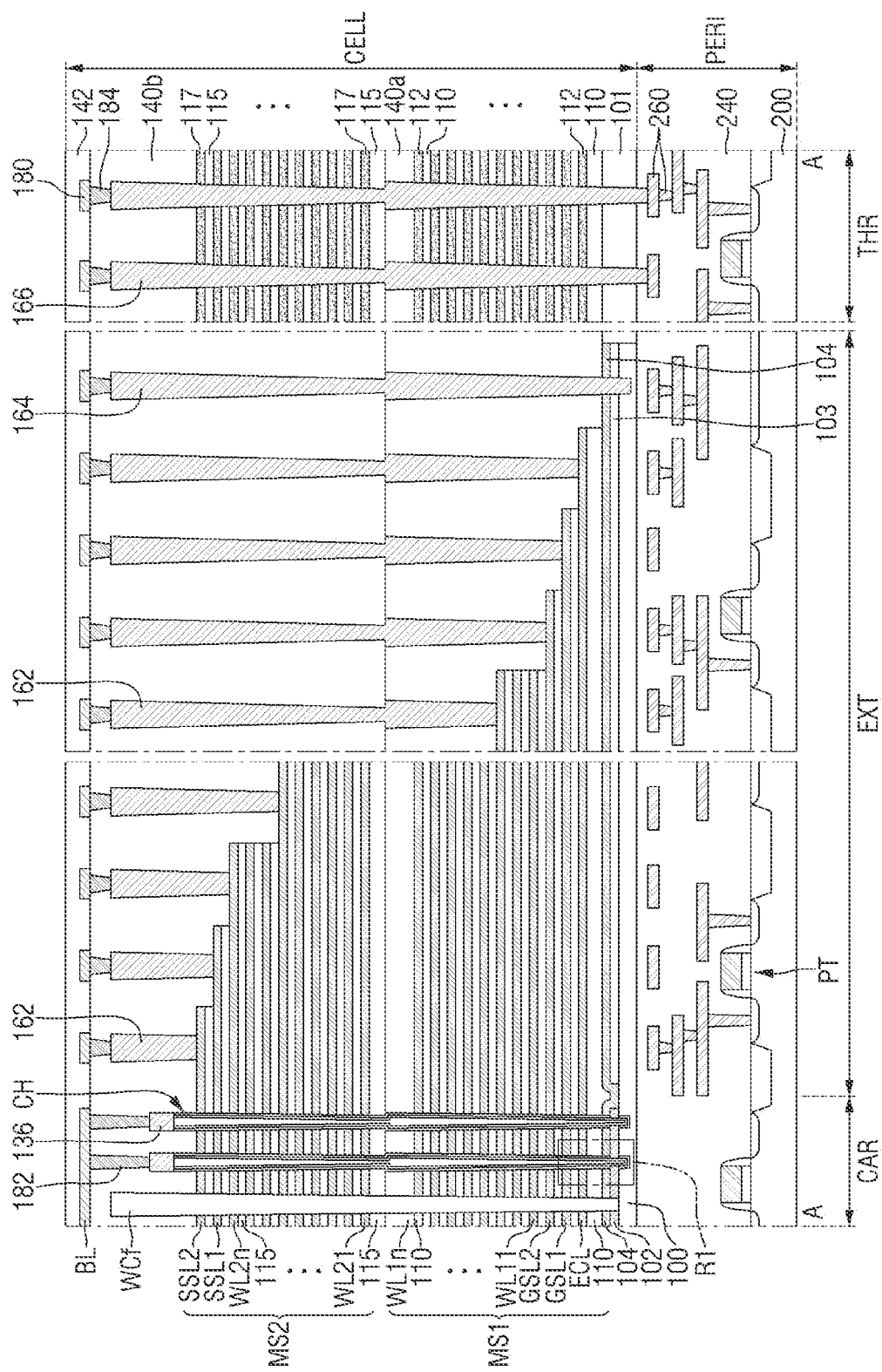
FIG. 4 is a cross-sectional view taken along line A-A of FIG. 3.
Figure 5:
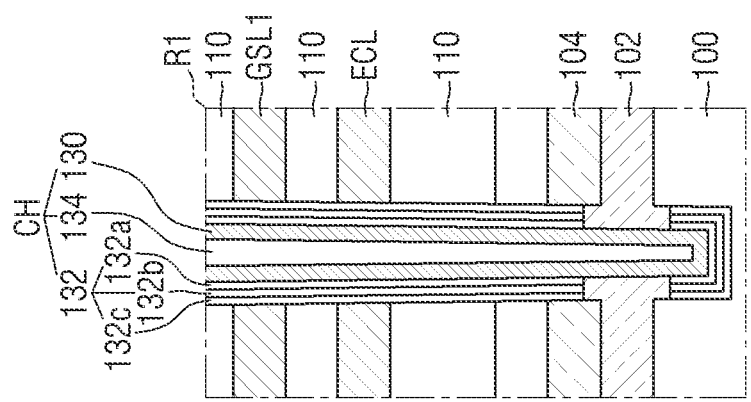
FIG. 5 is an enlarged view illustrating a region R1 of FIG. 4.
Figure 6:
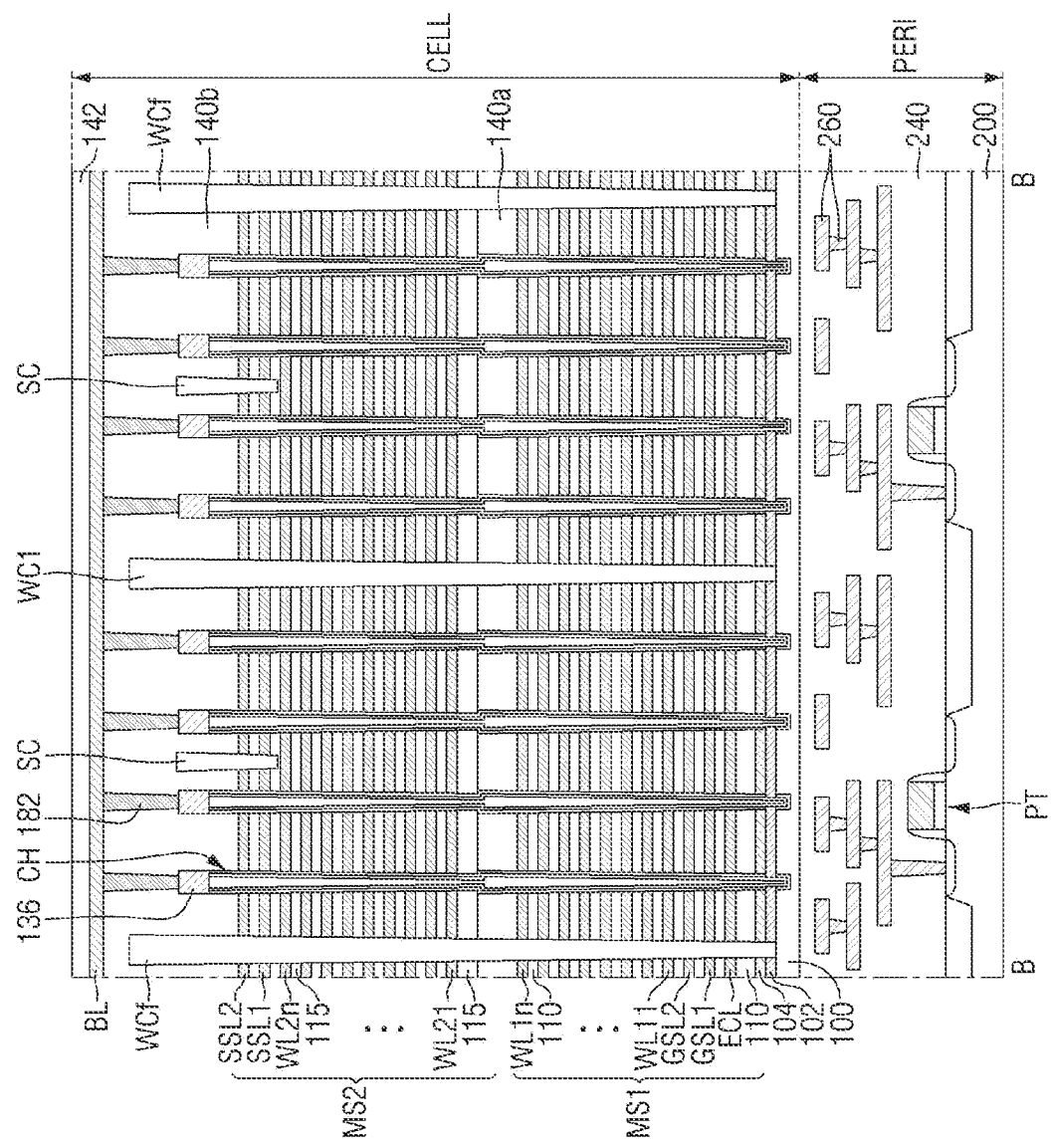
FIG. 6 is a cross-sectional view taken along line B-B of FIG. 3.
Figure 7:
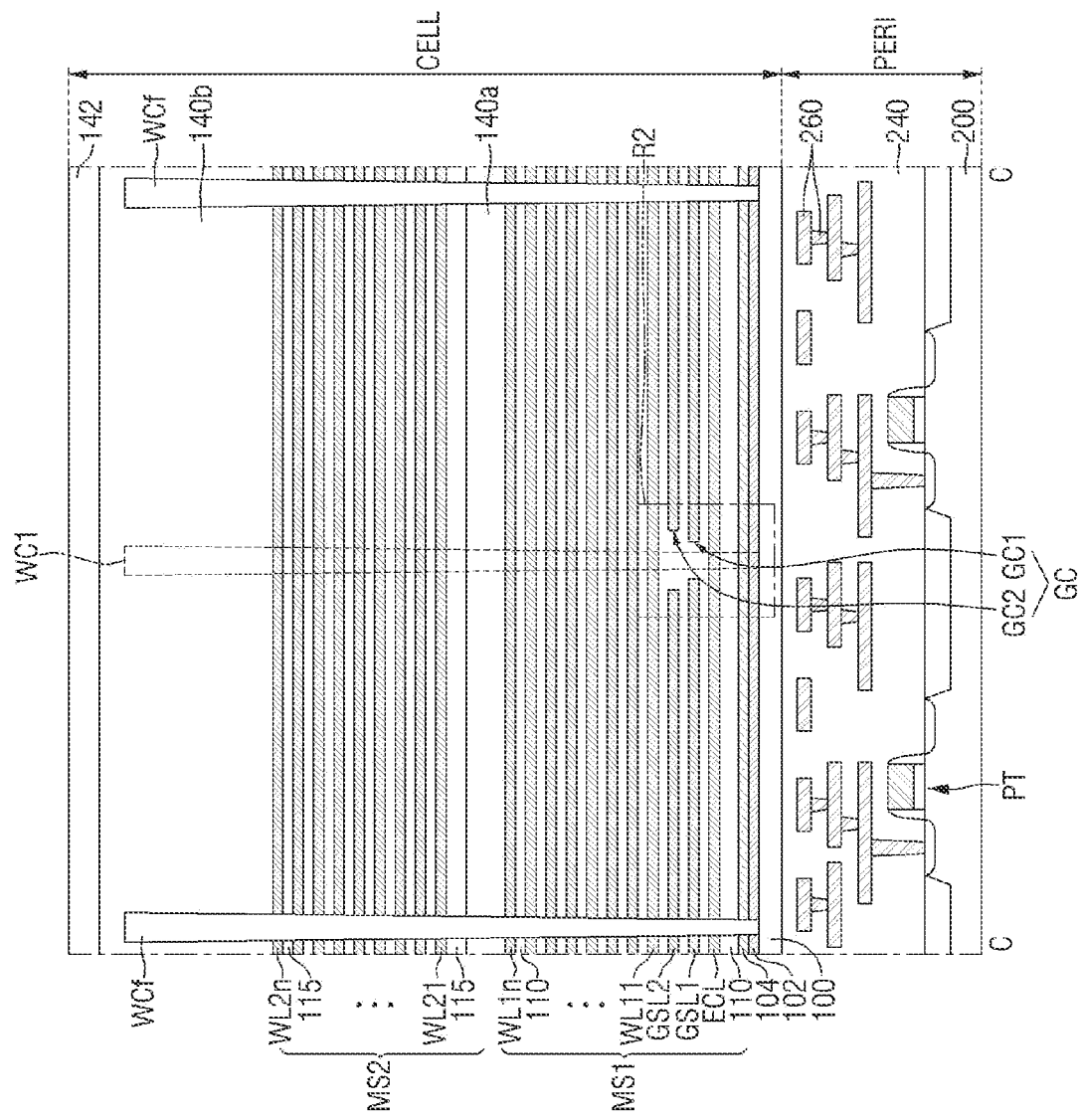
FIG. 7 is a cross-sectional view taken along line C-C of FIG. 3.
Figure 8A:
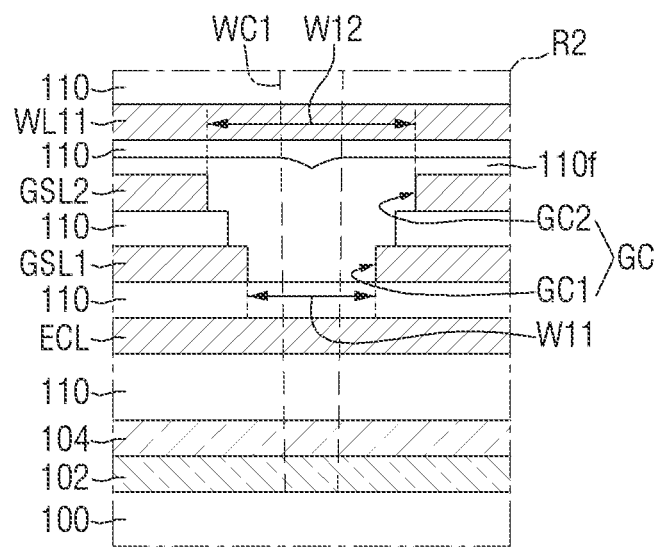
FIGS. 8A and 8B are various enlarged views illustrating a region R2 of FIG. 7.
Figure 8B:
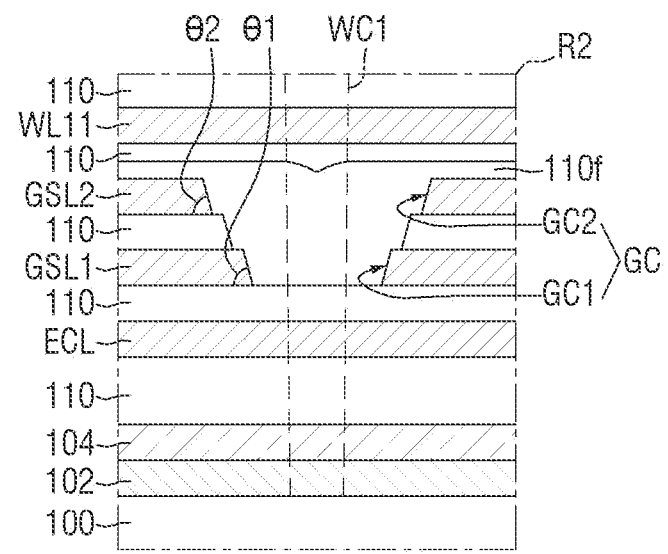
Figure 9:
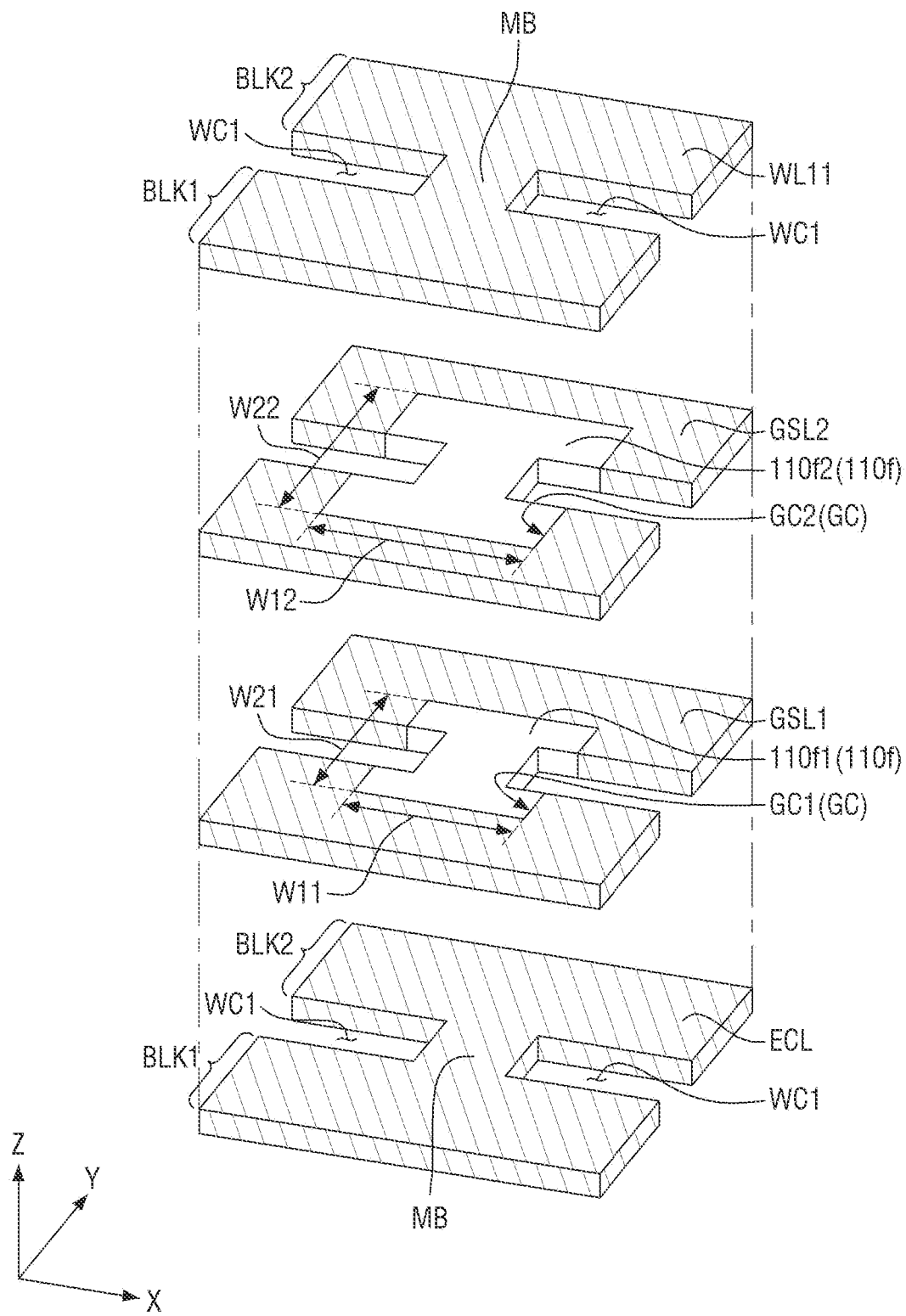
FIG. 9 is a conceptual view illustrating the region R2 of FIG. 7.

FIG. 3 is an example layout view illustrating a semiconductor memory device according to some embodiments. FIG. 4 is a cross-sectional view taken along line A-A of FIG. 3. FIG. 5 is an enlarged view illustrating a region R1 of FIG. 4. FIG. 6 is a cross-sectional view taken along line B-B of FIG. 3. FIG. 7 is a cross-sectional view taken along line C-C of FIG. 3. FIGS. 8A and 8B are various enlarged views illustrating a region R2 of FIG. 7. FIG. 9 is a conceptual view illustrating the region R2 of FIG. 7.

Referring to FIGS. 3 to 9, the semiconductor memory device according to some embodiments includes a memory cell region CELL and a peripheral circuit region PERI.

The memory cell region may include a cell substrate 100, an insulating substrate 101, mold structures MS1 and MS2, interlayer insulating layers 140a and 140b, a channel structure CH, a block isolation region WCf, a first partial isolation region WC1, a second partial isolation region WC2, a cutting opening GC, a string isolation structure SC, a bit line BL, a cell contact 162, a source contact 164, a through via 166 and a first wiring structure 180.

The cell substrate 100 may include a semiconductor substrate such as, for example, a silicon substrate, a germanium substrate or a silicon-germanium substrate. In some embodiments, the cell substrate 100 may include a silicon-on-insulator (SOI) substrate or a germanium-on-insulator (GOI) substrate. In some embodiments, the cell substrate 100 may include impurities. For example, the cell substrate 100 may include n-type impurities (e.g., phosphorus (P), arsenic (As), etc.).

The cell substrate 100 may include a cell array region CAR and an extended region EXT.

A memory cell array (e.g., 20 of FIG. 1) including a plurality of memory cells may be formed in the cell array region CAR. For example, the channel structure CH, the bit line BL and gate electrodes ECL, GSL1, GSL2, WL11 to WL1n, WL21 to WL2n, SSL1 and SSL2, which will be described later, may be disposed in the cell array region CAR. In the following description, a surface of the cell substrate 100 on which the memory cell array is disposed may be referred to as a front side of the cell substrate 100. On the contrary, a surface of the cell substrate 100, which is opposite to the front side of the cell substrate 100, may be referred to as a back side of the cell substrate 100.

The extended region EXT may be disposed near the cell array region CAR. In the extended region EXT, the gate electrodes ECL, GSL1, GSL2, WL11 to WL1n, WL21 to WL2n, SSL1 and SSL2, which will be described later, may be stacked in a stepwise manner.

In some embodiments, the cell substrate 100 may further include a through region THR. The through region THR may be disposed inside the cell array region CAR and the extended region EXT, or may be disposed outside the cell array region CAR and the extended region EXT. The through via 166, which will be described later, may be disposed in the through region THR.

The insulating substrate 101 may be formed in the cell substrate 100 of the extended region EXT. The insulating substrate 101 may form an insulating region in the cell substrate 100 of the extended region EXT. The insulating substrate 101 may include, but is not limited to, at least one of silicon oxide, silicon nitride, silicon oxynitride or silicon carbide. In some embodiments, the insulating substrate 101 may be formed in the cell substrate 100 of the through region THR.

Although a lower surface of the insulating substrate 101 is shown as being disposed on a lower surface and a coplanar surface of the cell substrate 100, it is only example. Alternatively, the lower surface of the insulating substrate 101 may be lower than that of the cell substrate 100.

The mold structures MS1 and MS2 may be formed on the front side of the cell substrate 100. The mold structures MS1 and MS2 may include a plurality of gate electrodes ECL, GSL1, GSL2, WL11 to WL1n, WL21 to WL2n, SSL1 and SSL2 and a plurality of mold insulating layers 110 and 115, which are stacked on the cell substrate 100. Each of the gate electrodes ECL, GSL1, GSL2, WL11 to WL1n, WL21 to WL2n, SSL1 and SSL2 and each of the mold insulating layers 110 and 115 may be a layered structure extended to the front side of the cell substrate 100 in parallel. The gate electrodes ECL, GSL1, GSL2, WL11 to WL1n, WL21 to WL2n, SSL1 and SSL2 may be spaced apart from one another by the mold insulating layers 110 and 115 and then sequentially stacked on the cell substrate 100.

In some embodiments, the mold structures MS1 and MS2 may include a first mold structure MS1 and a second mold structure MS2, which are sequentially stacked on the cell substrate 100.

The first mold structure MS1 may include first gate electrodes ECL1, GSL1, GSL2 and WL11 to WL1n and first mold insulating layers 110, which are alternately stacked on the cell substrate 100. In some embodiments, the first gate electrodes ECL1, GSL1, GSL2 and WL11 to WL1n may include an erase control line ECL, ground selection line GSL2 and a plurality of first word lines WL11 to WL1n, which are sequentially stacked on the cell substrate 100. The ground selection lines GSL1 and GSL2 may include a first ground selection line GSL1 and a second ground selection line GSL2, which are sequentially stacked. Although the first gate electrodes ECL1, GSL1, GSL2 and WL11 to WL1n are shown as including two ground selection lines GSL1 and GSL2, it is only example, and the first gate electrodes ECL1, GSL1, GSL2 and WL11 to WL1n may include three or more ground selection lines. In some embodiments, the erase control line ECL may be omitted.

The second mold structure MS2 may include second gate electrodes WL21 to WL2n, SSL1 and SSL2 and a second mold insulating layer 115, which are alternately stacked on the first mold structure MS1. In some embodiments, the second gate electrodes WL21 to WL2n, SSL1 and SSL2 may include a plurality of second word lines WL21 to WL2n and string selection lines SSL1 and SSL2, which are sequentially stacked on the first mold structure MS1. The string selection lines SSL1 and SSL2 may include a first string selection line SSL1 and a second string selection line SSL2, which are sequentially stacked. Although the second gate electrodes WL21 to WL2n, SSL1 and SSL2 are shown as including two string selection lines SSL1 and SSL2, it is only am example, and the second gate electrodes WL21 to WL2n, SSL1 and SSL2 may include three or more string selection lines.

Each of the gate electrodes ECL1, GSL1, GSL2, WL11 to WL1n, WL21 to WL2n, SSL1 and SSL2 may include, but are not limited to, a conductive material, for example, metal such as tungsten (W), cobalt (Co), nickel (Ni), etc., or semiconductor materials such as silicon.

Each of the mold insulating layers 110 and 115 may include an insulating material, for example, at least one of silicon oxide, silicon nitride or silicon oxynitride, but is not limited thereto.

In some embodiments, the mold structures MS1 and MS2 of the through region THR may include a plurality of mold sacrificial layers 112 and 117 and a plurality of mold insulating layers 110 and 115, which are alternately stacked on the cell substrate 100 and/or the insulating substrate 101. The respective mold sacrificial layers 112 and 117 and the respective mold insulating layers 110 and 115 may be a layered structure extended in parallel with an upper surface of the cell substrate 100. The mold sacrificial layers 112 and 117 may be spaced apart from each other by the mold insulating layers 110 and 115 and then sequentially stacked on the cell substrate 100.

In some embodiments, the first mold structure MS1 of the through region THR may include first mold sacrificial layers 112 and first mold insulating layers 110, which are alternately stacked on the cell substrate 100, and the second mold structure MS2 of the through region THR may include second mold sacrificial layers 117 and second mold insulating layers 115, which are alternately stacked on the first mold structure MS1.

Each of the mold sacrificial layers 112 and 117 may include an insulating material, for example, at least one of silicon oxide, silicon nitride or silicon oxynitride, but is not limited thereto. In some embodiments, the mold sacrificial layers 112 and 117 may include a material having an etch selectivity relative to the mold insulating layers 110 and 115. For example, the mold insulating layers 110 and 115 may include silicon oxide, and the mold sacrificial layers 112 and 117 may include silicon nitride.

The interlayer insulating layers 140a and 140b may be formed on the cell substrate 100 to cover or overlap the mold structure MS1 and MS2. In some embodiments, the interlayer insulating layers 140a and 140b may include a first interlayer insulating layer 140a and a second interlayer insulating layer 140b, which are sequentially stacked on the cell substrate 100. The first interlayer insulating layer 140a may cover or overlap the first mold structure MS1, and the second interlayer insulating layer 140b may cover or overlap the second mold structure MS2. The interlayer insulating layers 140a and 140b may include, but are not limited to, at least one of, for example, silicon oxide, silicon oxynitride or a low-k material having a dielectric constant smaller than that of silicon oxide.

The channel structure CH may be formed in the mold structures MS1 and MS2 of the cell array region CAR. The channel structure CH may be extended in a vertical direction (hereinafter, referred to as third direction Z) crossing or intersecting the upper surface of the cell substrate 100 to pass through the mold structures MS1 and MS2. For example, the channel structure CH may be a pillar shape (e.g., cylindrical shape) extended in the third direction Z. Therefore, the channel structure CH may cross or intersect one or more of the gate electrodes ECL1, GSL1, GSL2, WL11 to WL1n, WL21 to WL2n, SSL1 and SSL2. In some embodiments, the channel structure CH may have a bending portion between the first mold structure MS1 and the second mold structure MS2.

As shown in FIGS. 4 and 5, the channel structure CH may include a semiconductor pattern 130 and an information storage layer 132.

The semiconductor pattern 130 may extend in the third direction Z and pass through the mold structure MS1 and MS2. Although the semiconductor pattern 130 is shown in the form of a cup, it is only an example. For example, the semiconductor pattern 130 may have various shapes such as a cylindrical shape, a rectangular container shape, and a fully filled filler shape. The semiconductor pattern 130 may include, a semiconductor material such as monocrystalline silicon, polycrystalline silicon, an organic semiconductor and/or a carbon nanostructure, but is not limited thereto.

The information storage layer 132 may be interposed between the semiconductor pattern 130 and each of the gate electrodes ECL1, GSL1, GSL2, WL11 to WL1n, WL21 to WL2n, SSL1 and SSL2. For example, the information storage layer 132 may be extended along an outer side of the semiconductor pattern 130. The information storage layer 132 may include at least one of, for example, silicon oxide, silicon nitride, silicon oxynitride or a high-k material having a dielectric constant higher than that of silicon oxide. The high-k material may include at least one of, for example, aluminum oxide, hafnium oxide, lanthanum oxide, tantalum oxide, titanium oxide, lanthanum hafnium oxide, lanthanum aluminum oxide, dysprosium scandium oxide, or their combination.

In some embodiments, the information storage layer 132 may be formed of a multi-layer. For example, as shown in FIG. 5, the information storage layer 132 may include a tunnel insulating layer 132a, a charge storage layer 132b and a blocking insulating layer 132c, which are sequentially stacked on the outer side of the semiconductor pattern 130.

The tunnel insulating layer 132a may include, for example, silicon oxide, or a high-k material (e.g., aluminum oxide ($Al_2O_3$), hafnium oxide ($HfO_2$)) having a dielectric constant higher than that of silicon oxide. The charge storage layer 132b may include, for example, silicon nitride. The blocking insulating layer 132c may include, for example, silicon oxide, or a high-k material (e.g., aluminum oxide ($Al_2O_3$), hafnium oxide ($HfO_2$)) having a dielectric constant higher than that of silicon oxide.

In some embodiments, the channel structure CH may further include a filling pattern 134. The filling pattern 134 may be formed to fill the inside of the semiconductor pattern 130 having a cup shape. The filling pattern 134 may include an insulating material, for example, silicon oxide, but is not limited thereto.

In some embodiments, the channel structure CH may further include a channel pad 136. The channel pad 136 may be formed to be connected to an upper portion of the semiconductor pattern 130. The channel pad 136 may include, for example, polysilicon doped with impurities, but is not limited thereto.

In some embodiments, a plurality of channel structures CH may be arranged in a zigzag shape. For example, as shown in FIG. 3, the plurality of channel structures CH may be alternately arranged in the first direction X and the second direction Y parallel with the upper surface of the cell substrate 100. The plurality of channel structures CH arranged in a zigzag shape may further improve the degree of integration of the semiconductor memory device. In some embodiments, the plurality of channel structures CH may be arranged in a honeycomb shape.

In some embodiments, a dummy channel structure DCH may be formed in the mold structures MS1 and MS2 of the extended region EXT. The dummy channel structure DCH may be formed in a shape similar to that of the channel structure CH to relieve stress applied to the mold structures MS1 and MS2 in the extended region EXT.

In some embodiments, first source structures 102 and 104 may be formed on the cell substrate 100. The first source structures 102 and 104 may be interposed between the cell substrate 100 and the mold structures MS1 and MS2. For example, the first source structures 102 and 104 may be extended along the upper surface of the cell substrate 100. The first source structures 102 and 104 may be formed to be connected with the semiconductor pattern 130 of the channel structure CH. For example, as shown in FIG. 5, the first source structures 102 and 104 may be in contact with the semiconductor pattern 130 by passing through the information storage layer 132. The first source structures 102 and 104 may be provided as a common source line (e.g., CSL of FIG. 2) of the semiconductor memory device. The first source structures 102 and 104 may include, for example, polysilicon doped with impurities, or metal, but are not limited thereto.

In some embodiments, the channel structure CH may pass through the first source structure 102 and 104. For example, the lower portion of the channel structure CH may be disposed in the cell substrate 100 through the first source structures 102 and 104.

In some embodiments, the first source structures 102 and 104 may be formed of a multi-layer. For example, the first source structures 102 and 104 may include a first source layer 102 and a second source layer 104, which are sequentially stacked on the cell substrate 100. Each of the first source layer 102 and the second source layer 104 may include, but is not limited to, polysilicon doped with impurities or polysilicon that is not doped with impurities. The first source layer 102 may be provided as the common source line (e.g., CSL of FIG. 2) of the semiconductor memory device in contact with the semiconductor pattern 130. The second source layer 104 may be used as a support layer for preventing the mold stack from collapsing in a replacement process for forming the first source layer 102.

Although not shown, a base insulating layer may be interposed between the cell substrate 100 and the first source structures 102 and 104. The base insulating layer may include, but is not limited to, at least one of for example, silicon oxide, silicon nitride or silicon oxynitride.

In some embodiments, the first source structures 102 and 104 may not be formed in the extended region EXT in which the insulating substrate 101 is formed. Although the upper surface of the insulating substrate 101 is shown as being disposed on upper surfaces and coplanar surfaces of the first source structures 102 and 104, it is only an example. As another example, the upper surface of the insulating substrate 101 may be higher than the upper surfaces of the first source structures 102 and 104.

In some embodiments, a source sacrificial layer 103 may be formed on a portion of the cell substrate 100. For example, the source sacrificial layer 103 may be formed on a portion of the cell substrate 100 of the extended region EXT. The source sacrificial layer 103 may include a material having an etch selectivity with respect to the mold insulating layers 110 and 115. For example, the mold insulating layers 110 and 115 may include silicon oxide, and the source sacrificial layer 103 may include silicon nitride. The source sacrificial layer 103 may be a layer in which a portion of the first source structures 102 and 104 remains after being replaced with the first source layer 102 during the fabricating process of the first source structures 102 and 104.

Each of the block isolation region WCf, the first partial isolation region WC1 and the second partial isolation region WC2 may be extended in the first direction X to cut the mold structure MS1 and MS2. The block isolation region WCf may completely cut the mold structures MS1 and MS2. For example, the block isolation region WCf may be extended continuously in the first direction X. The first and second partial isolation regions WC1 and WC2 may partially cut the mold structures MS1 and MS2, respectively. For example, the first partial isolation regions WC1 of one row arranged along the first direction X may be separated from each other to partially cut the mold structures MS1 and MS2, and the second partial isolation regions WC2 of one row arranged along the first direction X may be spaced apart from each other to partially cut the mold structures MS1 and MS2.

The mold structures MS1 and MS2 may be divided by the block isolation region WCf and/or the first partial isolation region WC1, which are/is arranged along the second direction Y, to form a plurality of memory cell blocks (e.g., BLK1 to BLKn of FIG. 1). For example, as shown in FIG. 3, the first partial isolation regions WC1 of one row may be formed between two adjacent block isolation regions WCf. The first partial isolation regions WC1 of one row may define two memory cell blocks (e.g., the first cell block BLK1 and the second cell block BLK2) by separating the mold structures MS1 and MS2 between the two block isolation regions WCf.

Although the first partial isolation regions WC1 of one row are shown as being disposed between two adjacent block isolation regions WCf, it is only an example. As another example, the first partial isolation regions WC1 or two or more rows may be disposed between the two adjacent block isolation regions WCf.

The mold structures MS1 and MS2 may be divided by the block isolation region WCf, the first partial isolation region WC1, and/or the second partial isolation region WC2, which are arranged along the second direction Y, to form a plurality of zones. For example, as shown in FIG. 3, the second partial isolation regions WC2 of one row may be formed between the block isolation region WCf and the first partial isolation region WC1, which are adjacent to each other. The second partial isolation regions WC2 of one row may define two zones (e.g., first zone I and second zone II) by separating the memory cell blocks (e.g., the first cell block BLK1 and the second cell block BLK2).

Although the second partial isolation regions WC2 of one row are shown as being disposed between the block isolation region WCf and the first partial isolation region WC1, which are adjacent to each other, it is only an example. As anther example, the second partial isolation regions WC2 of two or more rows may be disposed between the block isolation region WCf and the first partial isolation region WC1, which are adjacent to each other.

As the first partial isolation region WC1 and the second partial isolation region WC2 partially cut the mold structures MS1 and MS2, the mold structures MS1 and MS2 may include a bridge region MB, which is a region that is not cut by the first partial isolation region WC1 and the second partial isolation region WC2. The bridge region MB may interconnect the memory cell blocks (e.g., the first cell block BLK1 and the second cell block BLK 2) or the zones (e.g., the first zone I and the second zone II) defined by the block isolation region WCf, the first partial isolation region WC1, and/or the second partial isolation region WC2. For example, as shown in FIG. 3, the bridge region MB may connect the first cell block BLK1 and the second cell block BLK2, which are separated by the first partial isolation regions WC1 of one row, with each other. The first partial isolation region WC1 and the bridge region MB may be alternately arranged along the first direction X.

As the bridge region MB is formed, the word lines WL11 to WL1n and WL21 to WL2n may be electrically connected to one another even though the word lines WL11 to WL1n and WL21 to WL2n are cut by the first partial isolation region WC1 and the second partial isolation region WC2. For example, each of the word lines WL11 to WL1n and WL21 to WL2n may be electrically connected along the first cell block BLK1 and the second cell block BLK2 by the bridge region MB defined by the first partial isolation regions WC1 of one row. Likewise, the erase control line ECL and the string selection lines SSL1 and SSL2 may be electrically connected along the first cell block BLK1 and the second cell block BLK 2 by the bridge region MB.

Although the bridge region MB is shown as being formed in the extended region EXT, it is only for convenience of description. Although not shown in detail, the bridge region MB may be formed in the cell array region CAR.

The ground selection lines GSL1 and GSL2 may include a cutting opening GC. The cutting opening GC may be formed as the bridge region MB of the ground selection lines GSL1 and GSL2 is removed. For example, the cutting opening GC may be formed as a region of the ground selection lines GSL1 and GSL2 disposed in the bridge region MB defined by the first partial isolation regions WC1 when one row is removed. This cutting opening GC may separate the ground selection lines GSL1 and GSL2 together with the first partial isolation region WC1. For example, the first partial isolation region WC1 and the cutting opening GC may be alternately arranged along the first direction X to separate the ground selection lines GSL1 and GSL2 of the first cell block BLK1 from the ground selection lines GSL1 and GSL2 of the second cell block BLK 2.

A width of the cutting opening GC may be increased as the distance of the cutting opening GC increases from the cell substrate 100. For example, as shown in FIGS. 7 to 9, the cutting opening GC may include a first cutting opening GC1 formed as the bridge region MB of the first ground selection line GSL1 is removed, and a second cutting opening GC2 formed as the bridge region MB of the second ground selection line GSL2 is removed. At this time, a size of the second cutting opening GC2 may be greater than that of the first cutting opening GC1. For example, a width W11 of the first cutting opening GC1 in the first direction X may be narrower than a width W12 of the second cutting opening GC2 in the first direction X. In some embodiments, a width W21 of the first cutting opening GC1 in the second direction Y may be narrower than a width W22 of the second cutting opening GC2 in the second direction Y. In some embodiments, the second cutting opening GC2 may surround the first cutting opening GC1 in view of a plane (e.g., in XY plane).

The ground isolation structure $110f$ may fill at least a portion of the cutting opening GC. For example, the ground isolation structure $110f$ may connect two first partial isolation regions WC1 adjacent to each other in the first direction X with each other, and may extend in the third direction Z to pass through the ground selection lines GSL1 and GSL2. Therefore, the ground isolation structure $110f$ may electrically separate the ground selection lines GSL1 and GSL2 together with the first partial isolation region WC1. For example, the first partial isolation region WC1 and the ground isolation structure $110f$ may be alternately arranged along the first direction X to electrically isolate the ground selection lines GSL1 and GSL2 of the first cell block BLK1 and the ground selection lines GSL1 and GSL2 of the second cell block BLK2. Therefore, the ground selection lines GSL1 and GSL2 of the first cell block BLK1 and the ground selection lines GSL1 and GSL2 of the second cell block BLK2 may be separately controlled.

As the width of the cutting opening GC is increased as the cutting opening GC increases in distance from the cell substrate 100, a width of the ground isolation structure $110f$ may also be increased as the ground isolation structure $110f$ increases in distance from the cell substrate 100. For example, as shown in FIG. 9, the ground isolation structure $110f$ may include a first separator $110f1$ filling the first cutting opening GC1 and a second separator $110f2$ filling the second cutting opening GC2. At this time, a size of the second separator $110f2$ may be greater than that of the first separator $110f1$.

In some embodiments, the ground isolation structure $110f$ may include a stepwise side. For example, as shown in FIGS. 8A and 8B, the width of the ground isolation structure $110f$ may be increased in a stepwise shape as the ground isolation structure $110f$ becomes far away from the cell substrate 100.

In some embodiments, the ground isolation structure $110f$ may include an inclined side. For example, as shown in FIG. 8B, a side of the first ground selection line GSL1 defined by the first cutting opening GC1 may form a first acute angle $\theta 1$ with a lower surface of the first ground selection line GSL1, and a side of the second ground selection line GSL2 defined by the second cutting opening GC2 may form a second acute angle $\theta 2$ with a lower surface of the second ground selection line GSL2. Each of the first acute angle $\theta 1$ and the second acute angle $\theta 2$ may be, for example, about 85° or less. Preferably, each of the first acute angle $\theta 1$ and the second acute angle $\theta 2$ may be about 30° to about 80°.

In some embodiments, an upper surface of the ground isolation structure $110f$ may be formed to be higher than that of the second ground selection line GSL2. The ground isolation structure $110f$ may cover or overlap the second ground selection line GSL2.

The ground isolation structure $110f$ may include an insulating material, for example, at least one of silicon oxide, silicon nitride or silicon oxynitride, but is not limited thereto. In some embodiments, the ground isolation structure $110f$ may include silicon oxide formed by a high density plasma (HDP) CVD process. Although a boundary between the ground isolation structure 110*f* and the first mold insulating layer 110 is shown, this is only an example. As the case may be, the boundary between the ground isolation structure 110*f* and the first mold insulating layer 110 may not exist.

The string isolation structure SC may be extended in the first direction X to cut the string selection lines SSL1 and SSL2. For example, the string isolation structure SC formed in the first cell block BLK1 may divide the string selection lines SSL1 and SSL2 into the first zone I and the second zone II, respectively. Therefore, the first string selection line SSL1 of the first zone I and the first string selection line SSL1 of the second zone II may be separately controlled, and the second string selection line SSL2 of the first zone I and the second string selection line SSL2 of the second zone II may be separately controlled.

The string isolation structure SC may include an insulating material, for example, at least one of silicon oxide, silicon nitride or silicon oxynitride, but is not limited thereto.

The bit line BL may be formed on the mold structures MS1 and MS2. The bit line BL may extend in the second direction Y to cross or intersect the block isolation region WCf. Further, the bit line BL may extend in the second direction Y and connect to the plurality of channel structures CH arranged along the second direction Y. For example, a bit line contact 182 connected to an upper portion of each channel structure CH may be formed in the second interlayer insulating layer 140*b*. The bit line BL may be electrically connected to the channel structures CH through the bit line contact 182.

The cell contact 162 may be connected to the respective gate electrodes ECL, GSL1, GSL2, WL11 to WL1*n*, WL21 to WL2*n*, SSL1 and SSL2. For example, the cell contact 162 may extend in the third direction Z inside the interlayer insulating layers 140*a* and 140*b* and then connect to the respective gate electrodes ECL, GSL1, GSL2, WL11 to WL1*n*, WL21 to WL2*n*, SSL1 and SSL2. In some embodiments, the cell contact 162 may have a bending portion between the first mold structure MS1 and the second mold structure MS2.

The source contact 164 may be connected to the first source structures 102 and 104. For example, the source contact 164 may extend in the third direction Z inside the interlayer insulating layers 140*a* and 140*b* and then connect to the cell substrate 100. In some embodiments, the source contact 164 may have a bending portion between the first mold structure MS1 and the second mold structure MS2.

The through via 166 may be disposed in the through region THR. For example, the through via 166 may extend in the third direction Z inside the mold structures MS1 and MS2 of the through region THR. In some embodiments, the through via 166 may have a bending portion between the first mold structure MS1 and the second mold structure MS2. Although the through via 166 is shown as being only passing through the mold structures MS1 and MS2, it is only an example. As another example, the through via 166 may be disposed outside the mold structures MS1 and MS2 so as not to pass through the mold structures MS1 and MS2.

Each of the cell contact 162, the source contact 164 and the through via 166 may be connected to the first wiring structure 180 on the interlayer insulating layers 140*a* and 140*b*. For example, a first interconnection insulating layer 142 may be formed on the second interlayer insulating interlayer 140*b*. The first wiring structure 180 may be formed in the first interconnection insulating layer 142. Each of the cell contact 162, the source contact 164 and the through via 166 may be connected to the first wiring structure 180 by a contact via 184. Although not shown in detail, the first wiring structure 180 may be connected to the bit line BL.

The peripheral circuit region PERI may include a peripheral circuit board 200, a peripheral circuit element PT and a second wiring structure 260.

The peripheral circuit board 200 may be disposed below the cell substrate 100. For example, an upper surface of the peripheral circuit board 200 may face a lower surface of the cell substrate 100. The peripheral circuit board 200 may include a semiconductor substrate such as a silicon substrate, a germanium substrate or a silicon-germanium substrate. In some embodiments, the peripheral circuit board 200 may include a silicon-on-insulator (SOI) substrate or a germanium-on-insulator (GOI) substrate.

The peripheral circuit element PT may be formed on the peripheral circuit board 200. The peripheral circuit element PT may constitute a peripheral circuit (e.g., 30 of FIG. 1) that controls the operation of the semiconductor memory device. For example, the peripheral circuit element PT may include a control logic (e.g., 37 of FIG. 1), a row decoder (e.g., 33 of FIG. 1) and/or a page buffer (e.g., 35 of FIG. 1). In the following description, a surface of the peripheral circuit board 200 on which the peripheral circuit element PT is disposed may be referred to as a front side of the peripheral circuit board 200. On the contrary, a surface of the peripheral circuit board 200, which is opposite to the front side of the peripheral circuit board 200, may be referred to as a back side of the peripheral circuit board 200.

The peripheral circuit element PT may include, for example, a transistor, but is not limited thereto. For example, the peripheral circuit element PT may include various passive elements such as capacitors, resistors and inductors, as well as various active elements such as transistors.

In some embodiments, the back side of the cell substrate 100 may face the front side of the peripheral circuit board 200. For example, a second interconnection insulating layer 240 covering the peripheral circuit element PT may be formed on the front side of the peripheral circuit board 200. The cell substrate 100 and/or the insulating substrate 101 may be stacked on an upper surface of the second interconnection insulating layer 240.

The first wiring structure 180 may be connected to the peripheral circuit element PT through the through via 166. For example, the second wiring structure 260 connected to the peripheral circuit element PT may be formed in the second interconnection insulating layer 240. The through via 166 may be extended in the third direction Z to connect the first wiring structure 180 with the second wiring structure 260. Therefore, the bit lines BL, each of the gate electrodes ECL, GSL1, GSL2, WL11 to WL1*n*, WL21 to WL2*n*, SSL1 and SSL2 and/or the first source structures 102 and 104 may be electrically connected to the peripheral circuit element PT.

In some embodiments, the through via 166 may connect the first wiring structure 180 with the second wiring structure 260 by passing through the insulating substrate 101. As a result, the through via 166 may be electrically separated from the cell substrate 100.

As an aspect ratio AR of the semiconductor memory device is increased, a leaning phenomenon, in which each memory cell block is broken or inclined, may occur. To avoid this, the memory cell blocks may be patterned in a shape of 'H' to form a bridge region for supporting a portion between the memory cell blocks. In addition, the memory cell blocks connected by the bridge region may be controlled separately from each other by a cutting opening formed as the bridge region of the ground selection line is removed.

Meanwhile, for high integration of the semiconductor memory device, a plurality of ground selection lines (e.g., two or more ground selection lines) may be required. However, since the cutting openings for the plurality of ground selection lines are formed to be relatively deep, a problem occurs in that it is difficult to control a gap fill process for filling an insulating material and a defect such as a dent.

However, the ground selection lines GSL1 and GSL2 of the semiconductor memory device according to some embodiments have a cutting opening GC having a stepwise width, thereby facilitating the control of the gap-fill process and the defect. In detail, as described above, since the width of the cutting opening GC may be increased as the cutting opening GC becomes far away from the cell substrate 100, it is easy to form the ground isolation structure 110f for filling the cutting opening GC. In addition, since the ground isolation structure 110f for filling the cutting opening GC has an improved flatness, it is easy to control a defect such as a dent caused by a subsequent process. As a result, process difficulty and the defect may be reduced, whereby a semiconductor memory device with improved yield may be provided.

Figure 10:
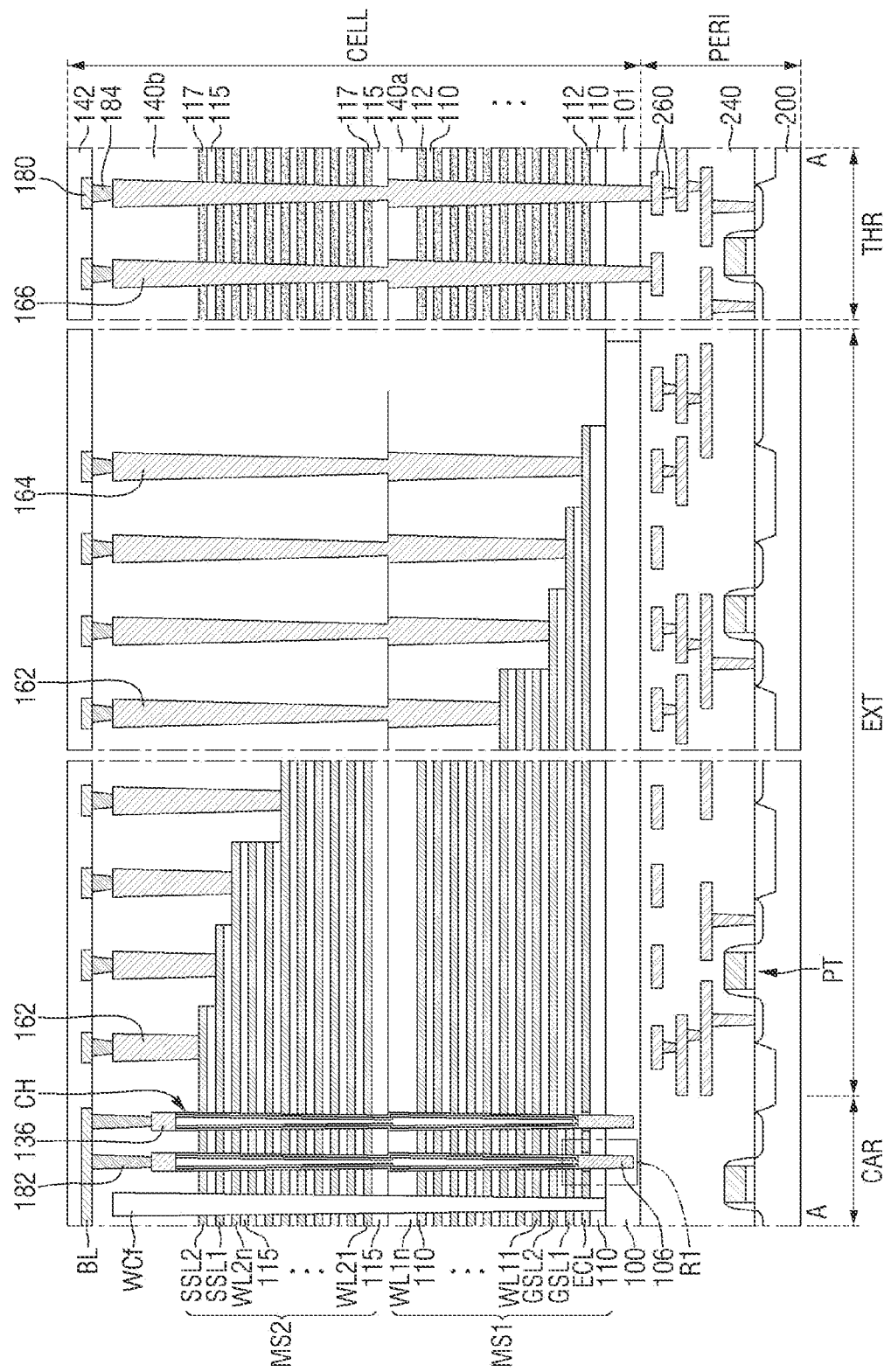
FIG. 10 is a cross-sectional view illustrating a semiconductor memory device according to some embodiments.
Figure 11:
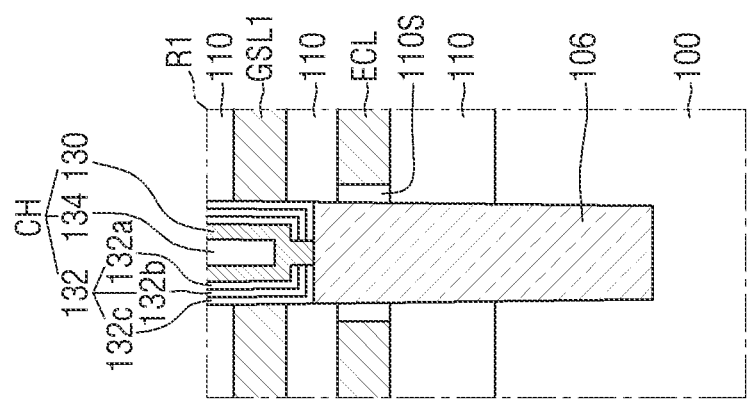
FIG. 11 is an enlarged view illustrating a region R1 of FIG. 10.

FIG. 10 is a cross-sectional view illustrating a semiconductor memory device according to some embodiments. FIG. 11 is an enlarged view illustrating a region R1 of FIG. 10. For convenience of description, portions duplicated with those described with reference to FIGS. 1 to 9 will be described briefly or omitted.

Referring to FIGS. 10 and 11, the semiconductor memory device according to some embodiments includes a second source structure 106.

The second source structure 106 may be formed on the cell substrate 100. Although a lower portion of the second source structure 106 is shown as being disposed inside the cell substrate 100, this is only an example. The second source structure 106 may be connected to the semiconductor pattern 130 of the channel structure CH. For example, the semiconductor pattern 130 may be in contact with an upper surface of the second source structure 106 by passing through the information storage layer 132. The second source structure 106 may be formed from, for example, the cell substrate 100 by a selective epitaxial growth process, but is not limited thereto.

In some embodiments, the upper surface of the second source structure 106 may cross or intersect a portion of the gate electrodes ECL, GSL1, GSL2, WL11 to WL1n, WL21 to WL2n, SSL1 and SSL2. For example, the upper surface of the second source structure 106 may be higher than that of the erase control line ECL. In this case, a gate insulating layer 110S may be interposed between the gate electrode (e.g., erase control line ECL) crossing or intersecting the second source structure 106 and the second source structure 106.

Figure 12:
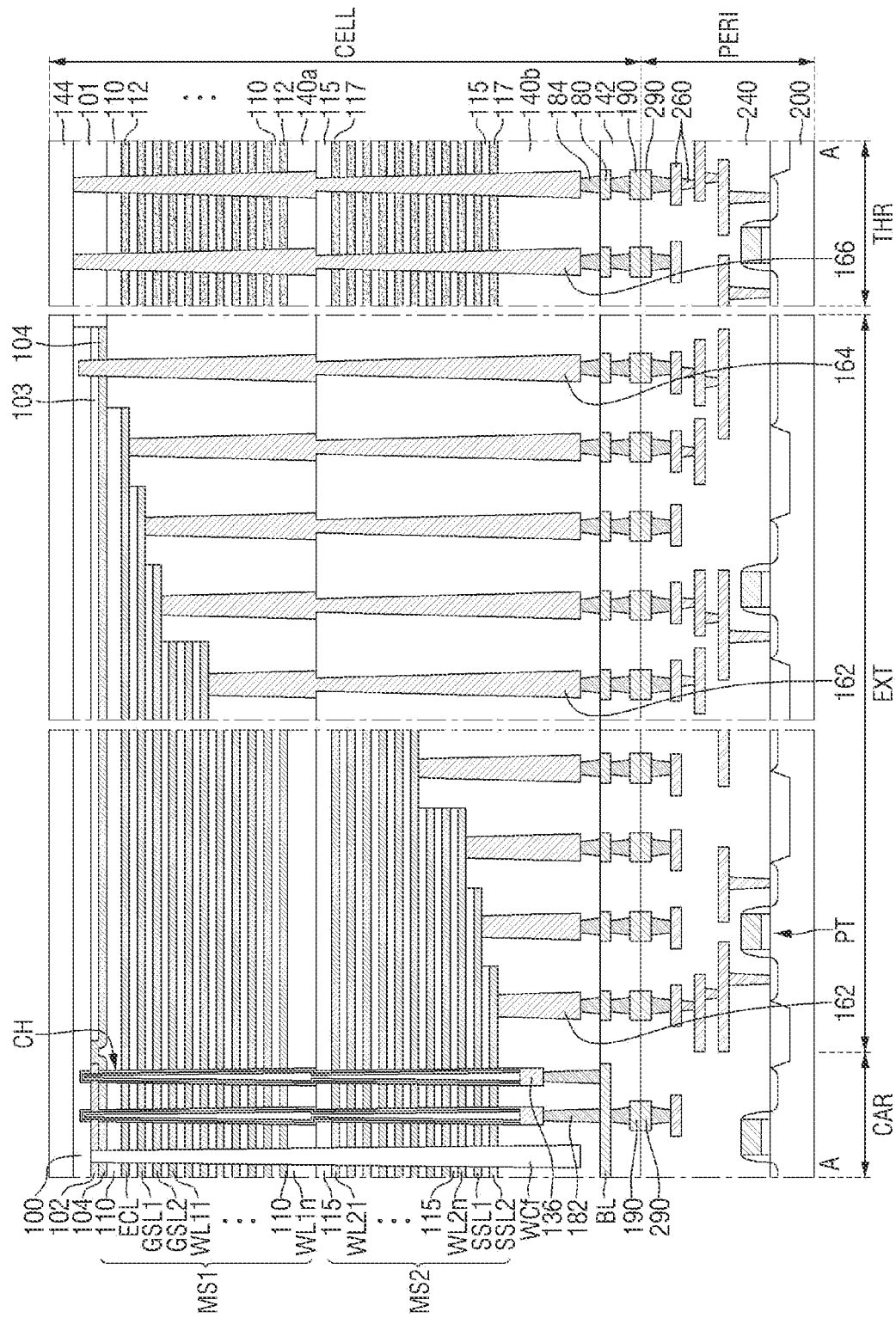
FIG. 12 is a cross-sectional view illustrating a semiconductor memory device according to some embodiments.

FIG. 12 is a cross-sectional view illustrating a semiconductor memory device according to some embodiments. For convenience of description, portions duplicated with those described with reference to FIGS. 1 to 9 will be described briefly or omitted.

Referring to FIG. 12, in the semiconductor memory device according to some embodiments, the front side of the cell substrate 100 faces that of the peripheral circuit board 200.

For example, the semiconductor memory device according to some embodiments may be a chip to chip (C2C) structure. In the C2C structure, after an upper chip including a memory cell region CELL is fabricated on a first wafer (e.g., cell substrate 100) and a lower chip including a peripheral circuit region PERI is fabricated on a second wafer (e.g., peripheral circuit board 200) different from the first wafer, the upper chip and the lower chip may be connected with each other by a bonding method.

For example, the bonding method may include that a first bonding metal 190 formed on the uppermost metal layer of the upper chip and a second bonding metal 290 formed on the uppermost metal layer of the lower chip are electrically connected to each other. For example, when each of the first bonding metal 190 and the second bonding metal 290 is formed of copper (Cu), the bonding method may be a Cu—Cu bonding method. However, this is only an example, and each of the first bonding metal 190 and the second bonding metal 290 may be formed of various metals such as aluminum (Al) or tungsten (W).

As the first bonding metal 190 and the second bonding metal 290 are bonded, the first wiring structure 180 may be connected to the second wiring structure 260. Therefore, the bit line BL, the respective gate electrodes ECL, GSL1, GSL2, WL11 to WL1n, WL21 to WL2n, SSL1 and SSL2, and/or the first source structures 102 and 104 may be electrically connected to the peripheral circuit element PT.

Hereinafter, a method for fabricating a semiconductor memory device according to example embodiments will be described with reference to FIGS. 1 to 40.

FIGS. 13 to 32 are views illustrating intermediate steps to describe a method for fabricating a semiconductor memory device according to some embodiments. For convenience of description, portions duplicated with those described with reference to FIGS. 1 to 12 will be described briefly or omitted.

Figure 13:
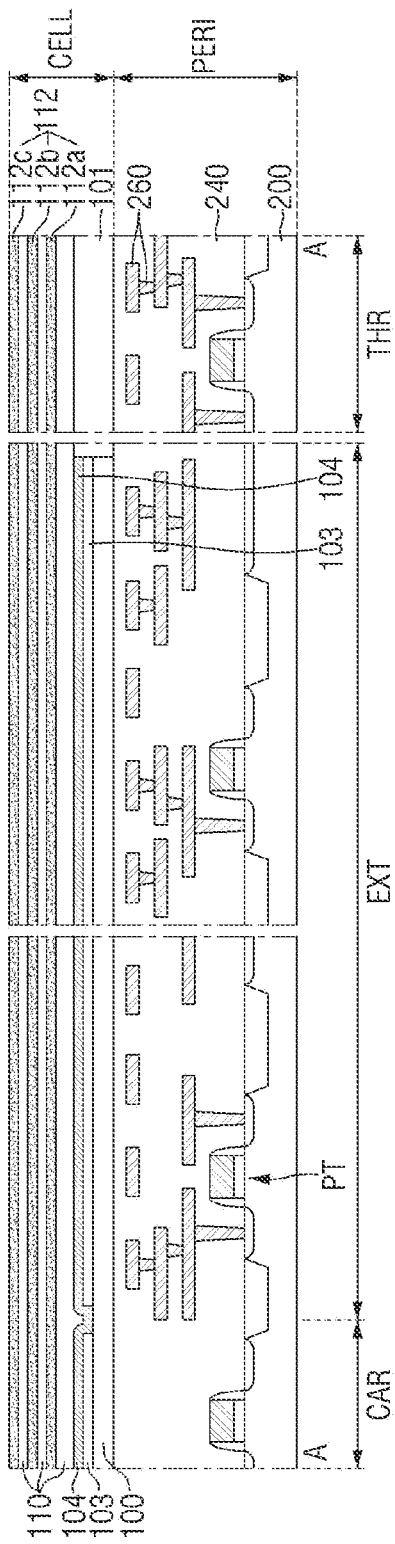
FIGS. 13 to 32 are views illustrating intermediate steps to describe a method for fabricating a semiconductor memory device according to some embodiments.
Figure 14:
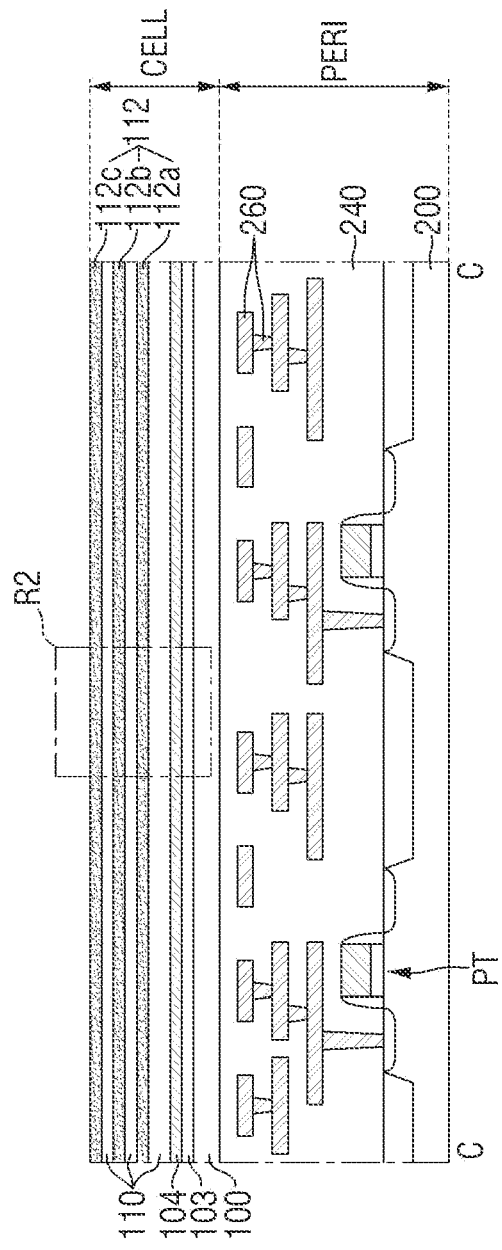
Figure 15:
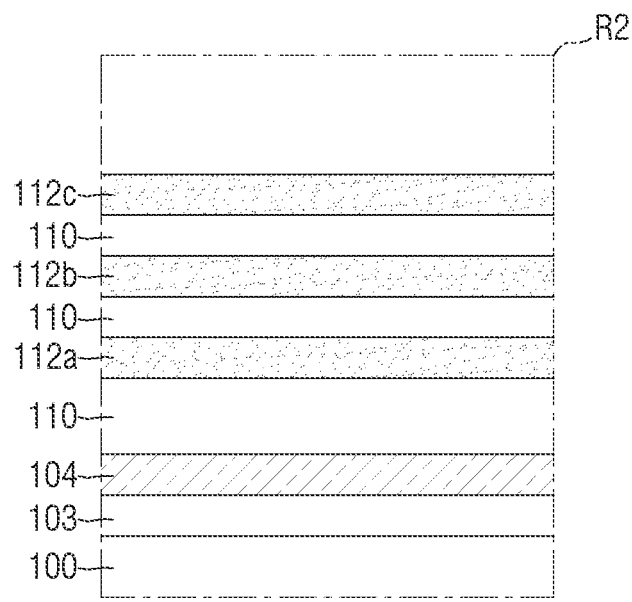

Referring to FIGS. 13 to 15, a first mold sacrificial layer 112 and a first mold insulating layer 110, which are alternately stacked, are formed on a cell substrate 100 and/or an insulating substrate 101.

The first mold sacrificial layer 112 may include a first sacrificial layer 112a, a second sacrificial layer 112b and a third sacrificial layer 112c, which are sequentially stacked. The first mold sacrificial layer 112 may include a material having an etch selectivity with respect to the first mold insulating layer 110. For example, the first mold insulating layer 110 may include silicon oxide, and the first mold sacrificial layer 112 may include silicon nitride.

In some embodiments, before the first mold sacrificial layer 112 and the first mold insulating layer 110 are stacked, a source sacrificial layer 103 and a second source layer 104 may be formed on the cell substrate 100 and/or the insulating substrate 101. The source sacrificial layer 103 may include a material having an etch selectivity with respect to the first mold insulating layer 110. For example, the first mold insulating layer 110 may include silicon oxide, and the source sacrificial layer 103 may include silicon nitride. The second source layer 104 may include, but is not limited to, polysilicon doped with impurities or polysilicon that is not doped with impurities.

In some embodiments, the cell substrate 100 and/or the insulating substrate 101 may be stacked on a peripheral circuit region PERI. For example, a peripheral circuit element PT, a second wiring structure 260 and a second interconnection insulating layer 240 may be formed on a peripheral circuit board 200. The cell substrate 100 and/or the insulating substrate 101 may be stacked on the second interconnection insulating layer 240.

Figure 16:
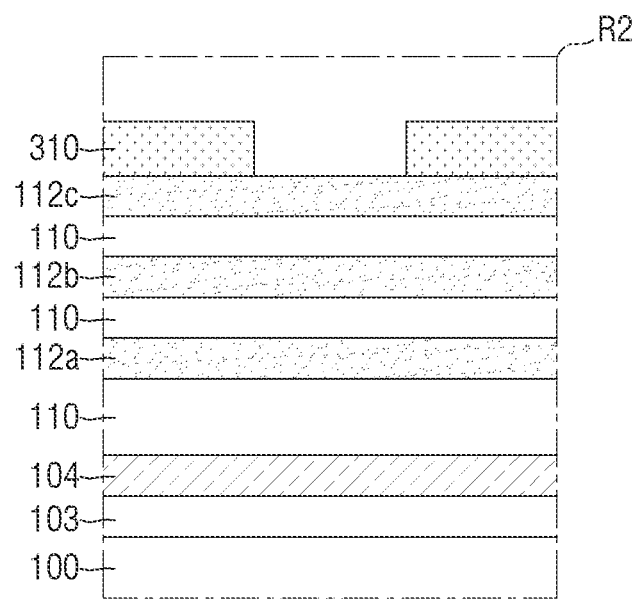

Referring to FIG. 16, a first mask layer 310 is formed on the first mold sacrificial layer 112 and the first mold insulating layer 110.

For example, the first mask layer 310 may be formed on the third sacrificial layer 112c. The first mask layer 310 may expose a region corresponding to the cutting opening GC described with reference to FIGS. 1 to 9. The first mask layer 310 may be, for example, a photoresist, but is not limited thereto.

Figure 17:
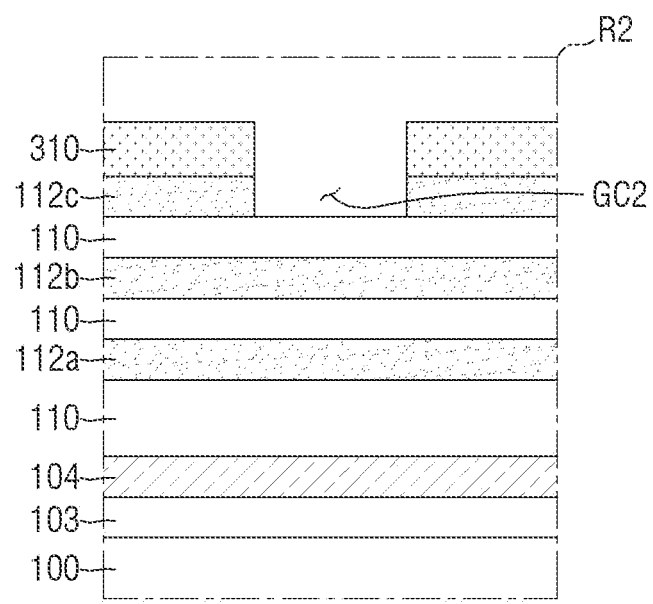

Referring to FIG. 17, a first etching process is performed using the first mask layer 310 as an etching mask. As the first etching process is performed, a portion of the third sacrificial layer 112c exposed by the first mask layer 310 may be removed. Therefore, a second cutting opening GC2 may be formed in the third sacrificial layer 112c.

Figure 18:
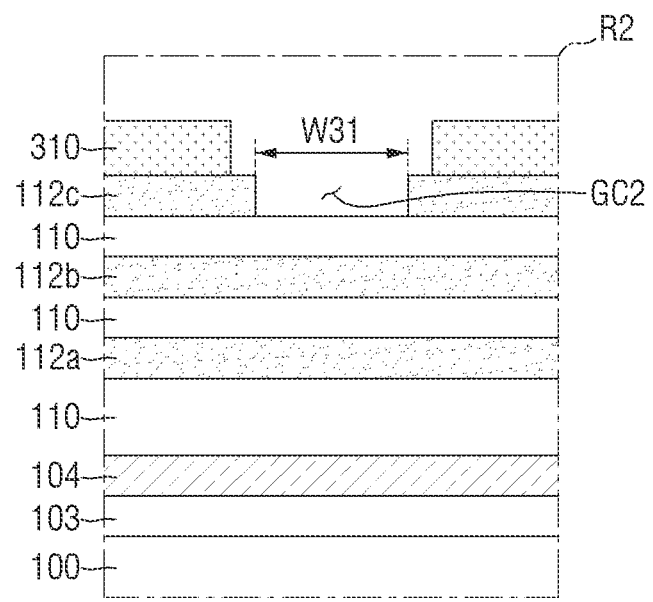

Referring to FIG. 18, a first trim process for the first mask layer 310 is performed. As the first trim process is performed, an opening of the first mask layer 310 may be wider than a width W31 of the second cutting opening GC2.

Figure 19:
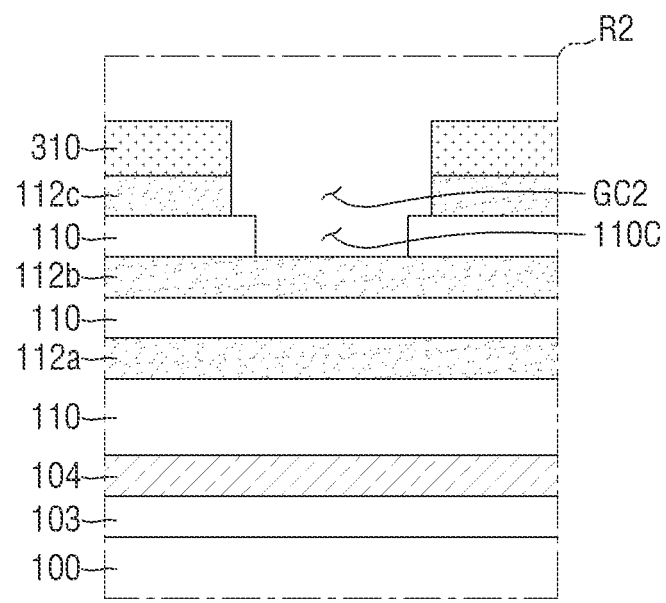

Referring to FIG. 19, a second etching process is performed using the first mask layer 310 as an etching mask. As the second etching process is performed, the second cutting opening GC2 may be wider than the mold opening 110C. A portion of the first mold insulating layer 110 exposed by the third sacrificial layer 112c may be removed. As a result, a mold opening 110C may be formed in the first mold insulating layer 110.

In some embodiments, after the second etching process is performed, a width of the mold opening 110C may be narrower than that of the second cutting opening GC2. For example, a portion of the third sacrificial layer 112c exposed from the first mask layer 310 may serve as an etching mask in the second etching process. As a result, the first mold insulating layer 110 and the third sacrificial layer 112c, which are patterned in a stepwise shape, may be provided.

Figure 20:
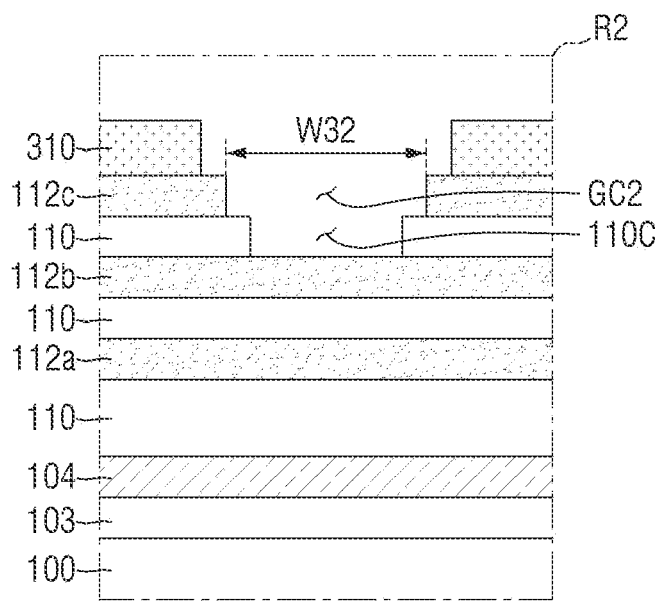

Referring to FIG. 20, a second trim process for the first mask layer 310 is performed. As the second trim process is performed, the opening of the first mask layer 310 may be wider than a width W32 of the second cutting opening GC2.

Figure 21:
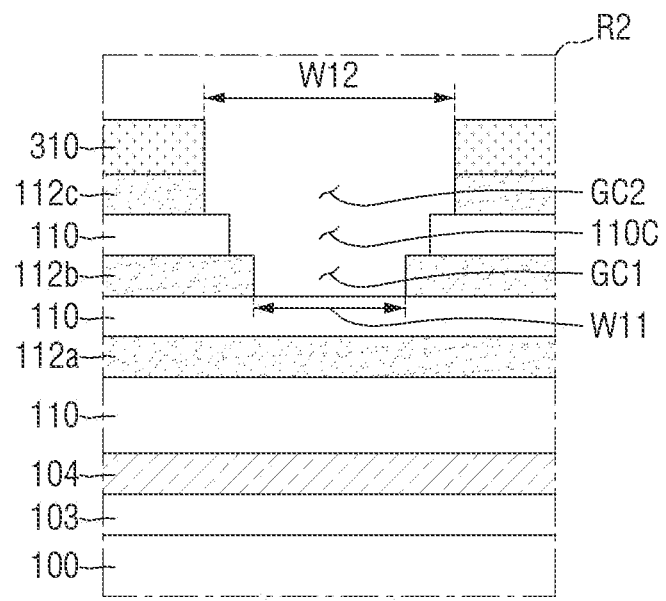

Referring to FIG. 21, a third etching process is performed using the first mask layer 310 as an etching mask. As the third etching process is performed, the second cutting opening GC2 and the mold opening 110C may be wider. Also, a portion of the second sacrificial layer 112b exposed by the first mold insulating layer 110 may be removed. As a result, a first cutting opening GC1 may be formed in the second sacrificial layer 112b.

In some embodiments, after the third etching process is performed, a width of the first cutting opening GC1 may be narrower than that of the second cutting opening GC2 and that of the mold opening 110C. For example, a portion of the third sacrificial layer 112c exposed from the first mask layer 310 and a portion of the first mold insulating layer 110 may serve as etching masks in the third etching process. As a result, the second sacrificial layer 112b, the first mold insulating layer 110 and the third sacrificial layer 112c, which are patterned in a stepwise shape, may be provided. In addition, a cutting opening GC may be provided, which is increased in width as it becomes far away from the cell substrate 100.

Figure 22:
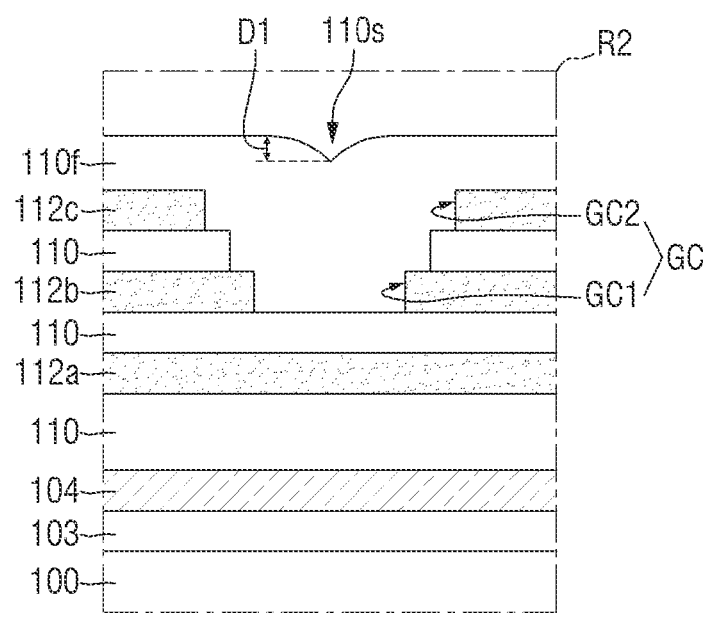

Referring to FIG. 22, a ground isolation structure 110f for filling the cutting opening GC is formed.

A gap fill process for filling the cutting opening GC using, for example, an insulating material may be performed. The insulating material may include, but is not limited to, at least one of, for example, silicon oxide, silicon nitride or silicon oxynitride. In some embodiments, the ground isolation structure 110f may include silicon oxide formed by a high density plasma (HDP) CVD process.

In some embodiments, as the ground isolation structure 110f is formed by the gap fill process, an upper surface of the ground isolation structure 110f may include a dent 110s.

As described above, since the cutting opening GC may have a stepwise width, it is easy to form the ground isolation structure 110f according to the gap fill process. In addition, the ground isolation structure 110f for filling the cutting opening GC has improved flatness, whereby a defect caused by a subsequent process may be easily controlled.

Figure 23:
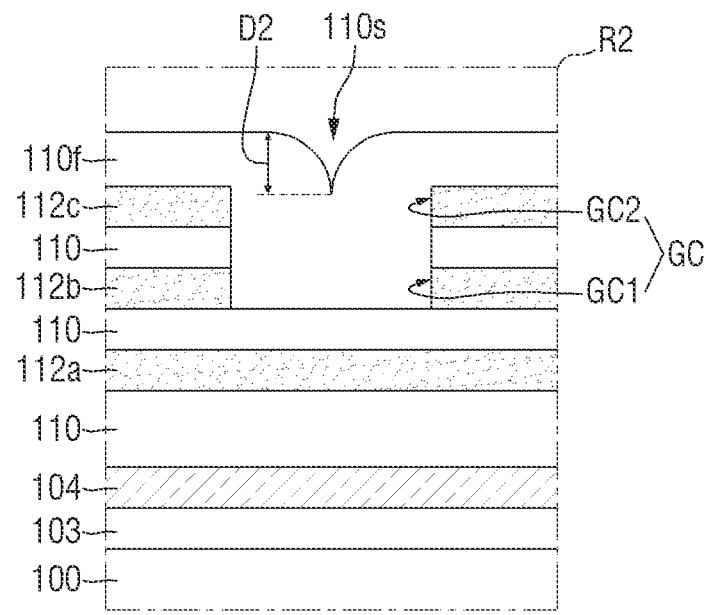

As shown in FIG. 23, when the cutting opening GC does not have a stepwise width (e.g., when the width of the first cutting opening GC1 and the width of the second cutting opening GC2 are almost equal to each other), the dent 110s of the ground isolation structure 110f may be formed to be relatively deep (e.g., a depth D2 of the dent 110s of FIG. 23 may be greater than a depth D1 of the dent 110s of FIG. 22).

Figure 24:
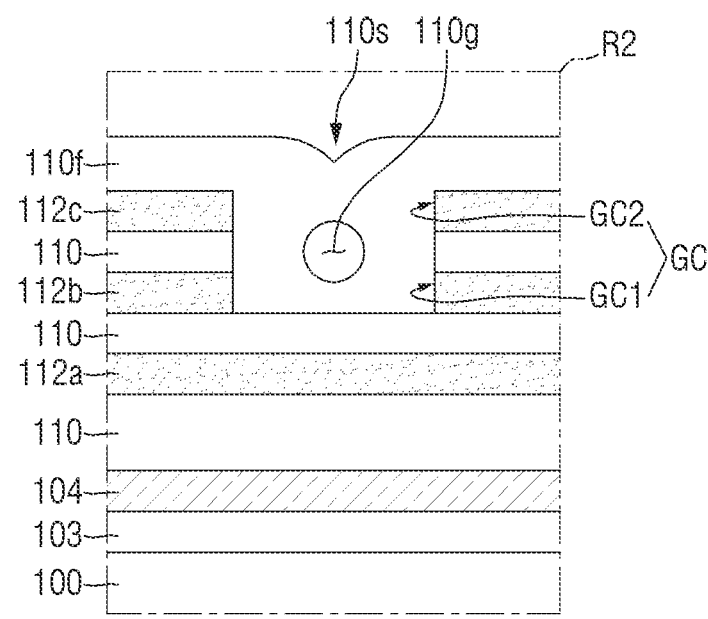

In some embodiments, as shown in FIG. 24, when the cutting opening GC does not have a stepwise width (e.g., when the width of the first cutting opening GC1 and the width of the second cutting opening GC2 are almost equal to each other), the ground isolation structure 110f may include a defect such as a void 110g.

Figure 25:
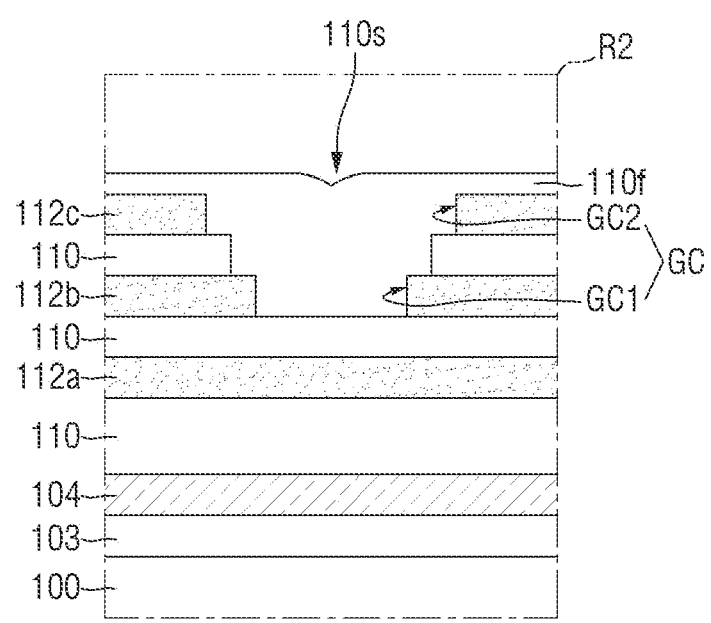

Referring to FIG. 25, a planarization process for the ground isolation structure 110f is performed.

The planarization process may include, for example, a wet etching process, but is not limited thereto. As the planarization process is performed, the dent 110s of the ground isolation structure 110f is downsized to further improve flatness of the ground isolation structure 110f.

Figure 26:
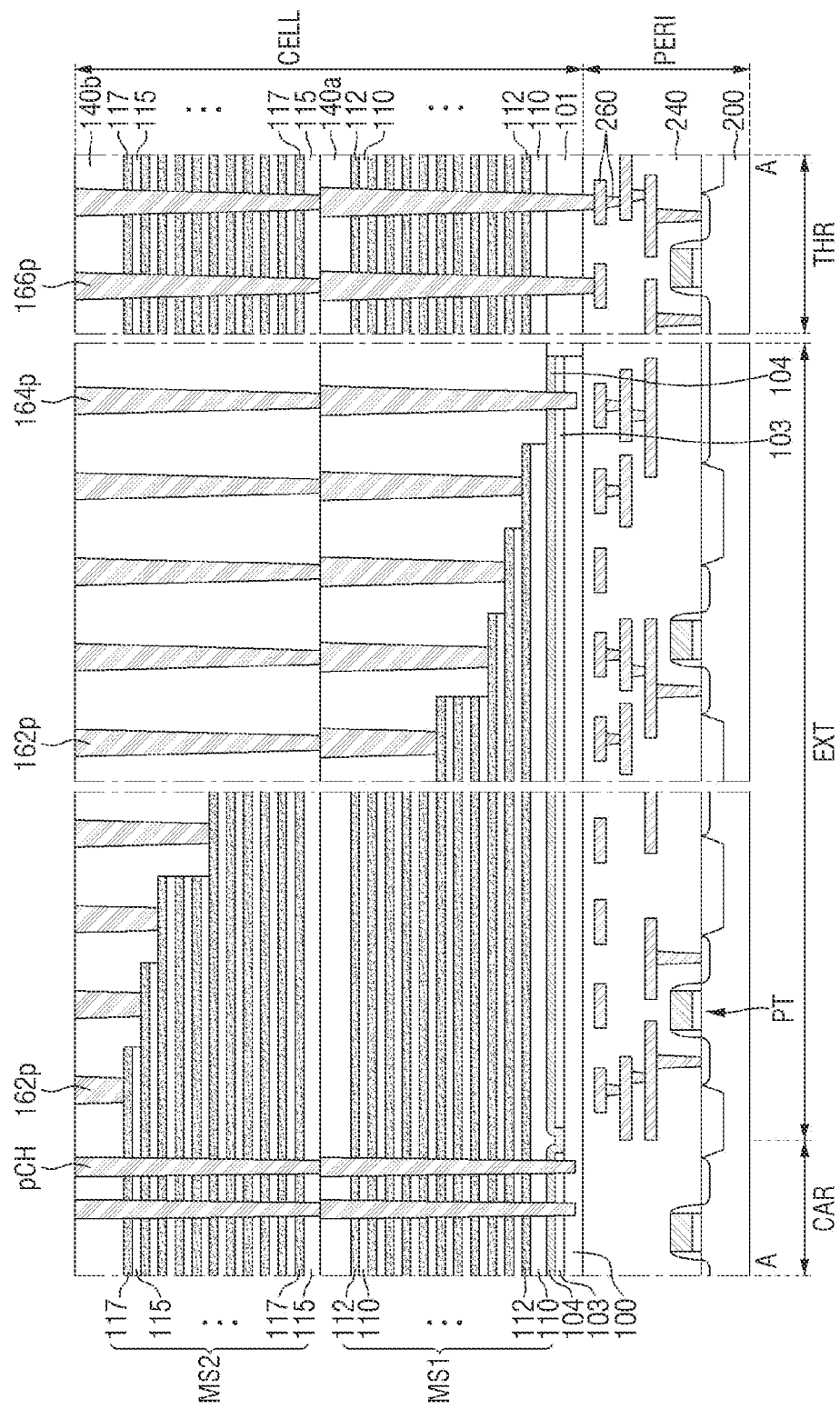
Figure 27:
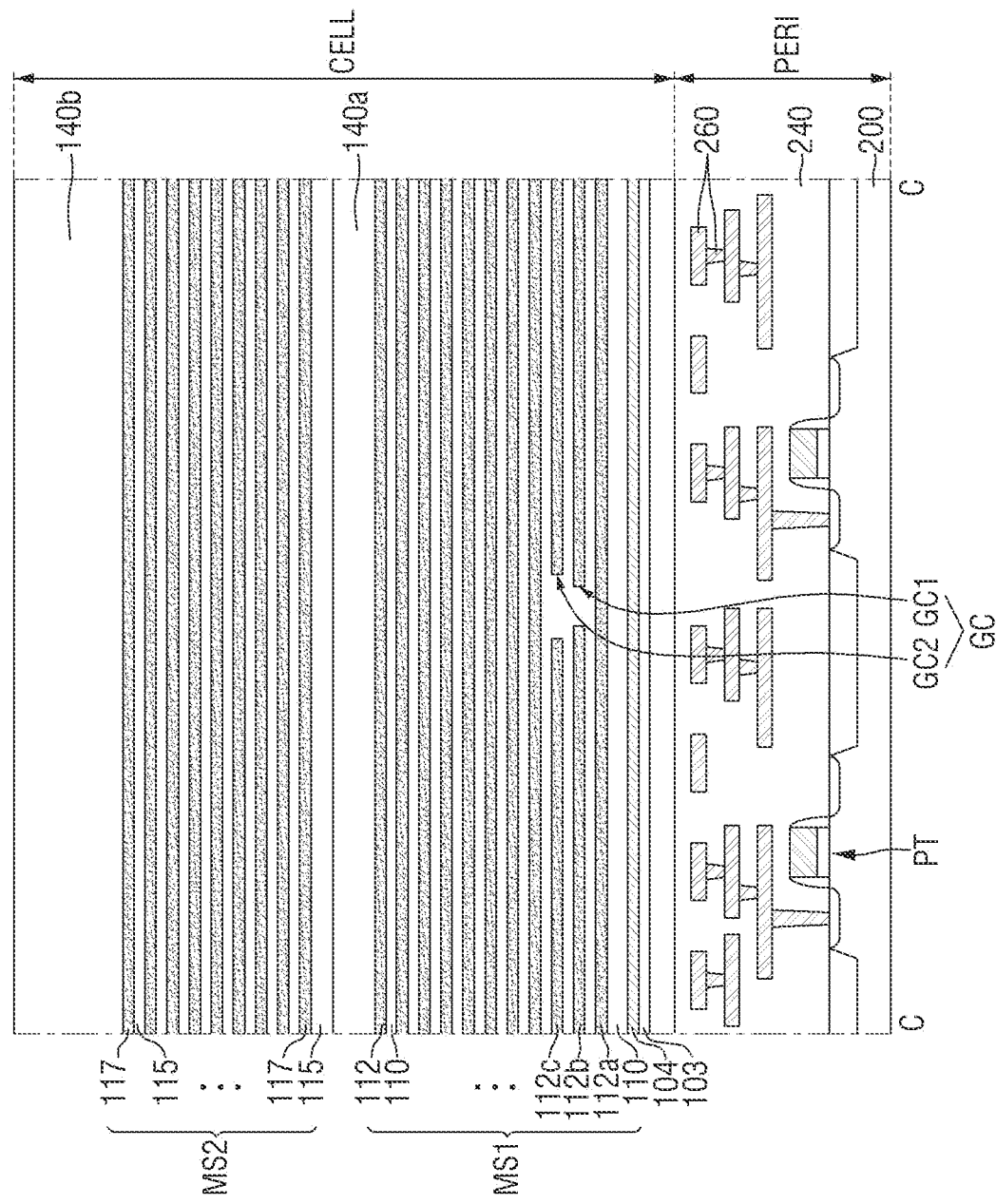

Referring to FIGS. 26 and 27, mold structures MS1 and MS2 are formed.

The mold structures MS1 and MS2 may include a plurality of mold sacrificial layers 112 and 117 and a plurality of mold insulating layers 110 and 115, which are stacked on the cell substrate 100. The mold sacrificial layers 112 and 117 may be spaced apart from each other by the mold insulating layers 110 and 115 and then sequentially stacked on the cell substrate 100. The mold structure MS1 and MS2 of the extended region EXT may be patterned in a stepwise shape.

In some embodiments, the mold structure MS1, MS2 may include a first mold structure MS1 and a second mold structure MS2, which are sequentially stacked on the cell substrate 100. The first mold structure MS1 may include first mold sacrificial layers 112 and first mold insulating layers 110, which are alternately stacked on the cell substrate 100. The second mold structure MS2 may include second mold sacrificial layers 117 and second mold insulating layers 115, which are alternately stacked on the first mold structure MS1.

A portion of the first mold sacrificial layers 112 may include the aforementioned cutting opening GC. For example, the second sacrificial layer 112b may include a first cutting opening GC1, and the third sacrificial layer 112c may include a second cutting opening GC2.

The mold sacrificial layers 112 and 117 may include a material having an etch selectivity with respect to the mold insulating layers 110 and 115. For example, the mold insulating layers 110 and 115 may include silicon oxide, and the mold sacrificial layers 112 and 117 may include silicon nitride.

Also, a preliminary channel pCH, a preliminary cell contact 162p, a preliminary source contact 164p and a preliminary through via 166p are formed.

The preliminary channel pCH may be extended in the third direction Z to pass through the mold structures MS1 and MS2. The preliminary cell contact 162*p* may be connected to the respective mold sacrificial layers 112 and 117. The preliminary source contact 164*p* may be connected to the first source structures 102 and 104. The preliminary through via 166*p* may be disposed in the through region THR.

In some embodiments, each of the preliminary channel pCH, the preliminary cell contact 162*p*, the preliminary source contact 164*p* and the preliminary through via 166*p* may have a bending portion between the first mold structure MS1 and the second mold structure MS2. For example, after the first mold structure MS1 is formed, a lower portion of each of the preliminary channel pCH, the preliminary cell contact 162*p*, the preliminary source contact 164*p* and the preliminary through via 166*p* may be formed. Subsequently, after the second mold structure MS2 is formed, an upper portion of each of the preliminary channel pCH, the preliminary cell contact 162*p*, the preliminary source contact 164*p* and the preliminary through via 166*p* may be formed. Each of the preliminary channel pCH, the preliminary cell contact 162*p*, the preliminary source contact 164*p* and the preliminary through via 166*p* may include, but is not limited to, polysilicon.

Figure 28:
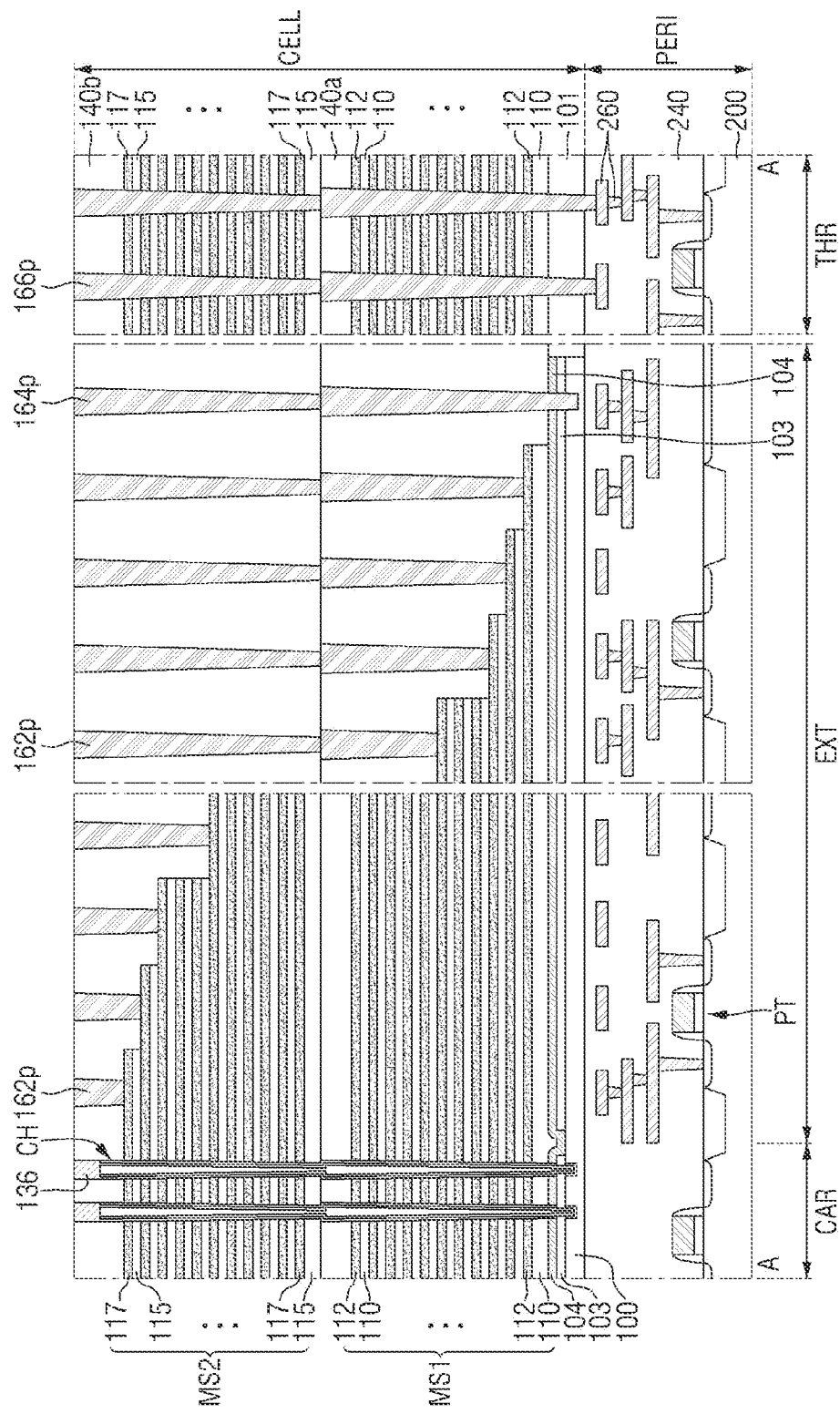

Referring to FIG. 28, a channel structure CH is formed.

For example, the preliminary channel pCH may be selectively removed. The channel structure CH may be formed to replace the region from which the preliminary channel pCH is removed.

Figure 29:
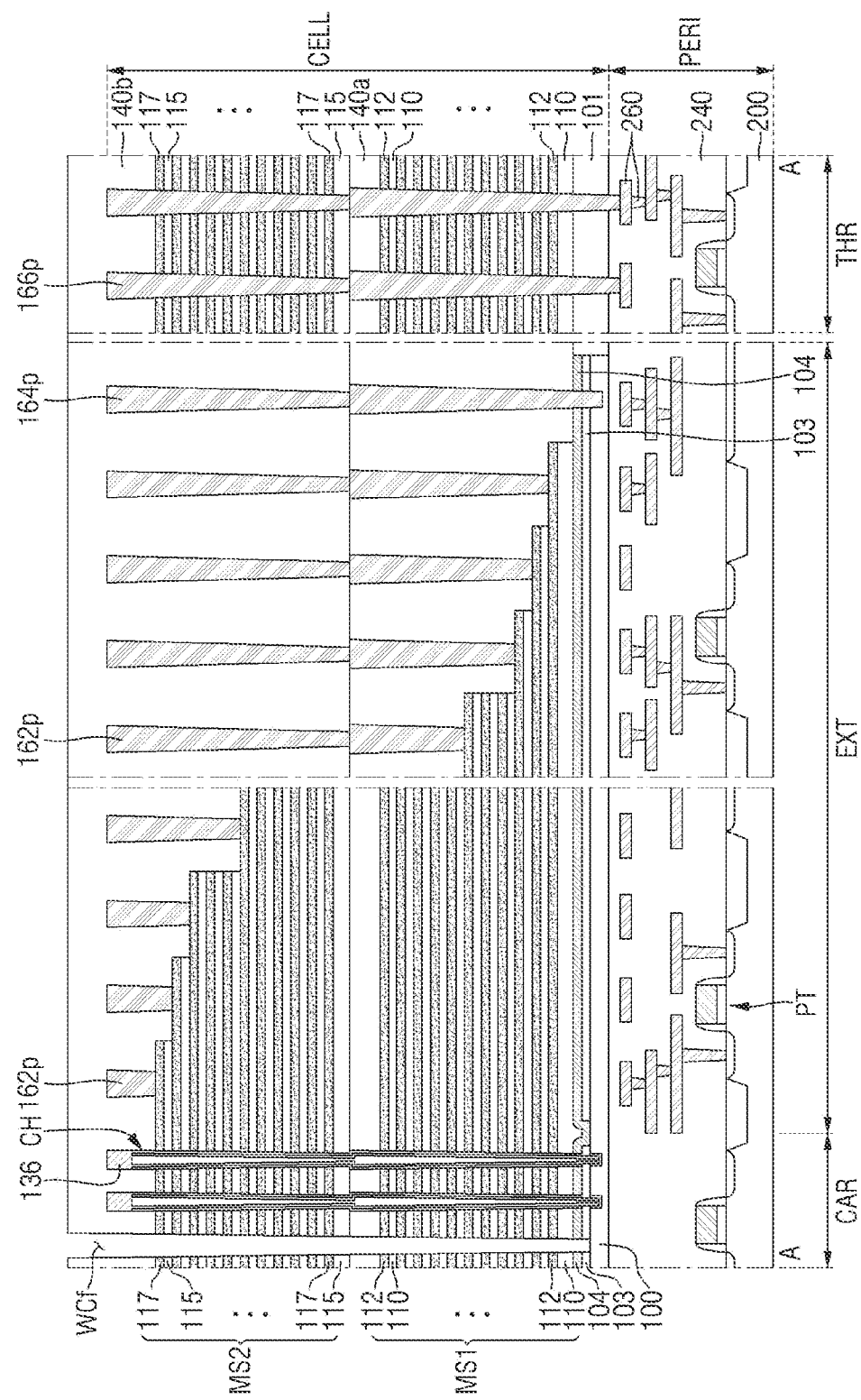

Referring to FIG. 29, a block isolation region WCf, a first partial isolation region WC1 and a second partial isolation region WC2 are formed.

Each of the block isolation region WCf, the first partial isolation region WC1 and the second partial isolation region WC2 may extend in a first direction (e.g., X in FIG. 3) to completely or partially cut the mold structures MS1 and MS2.

Figure 30:
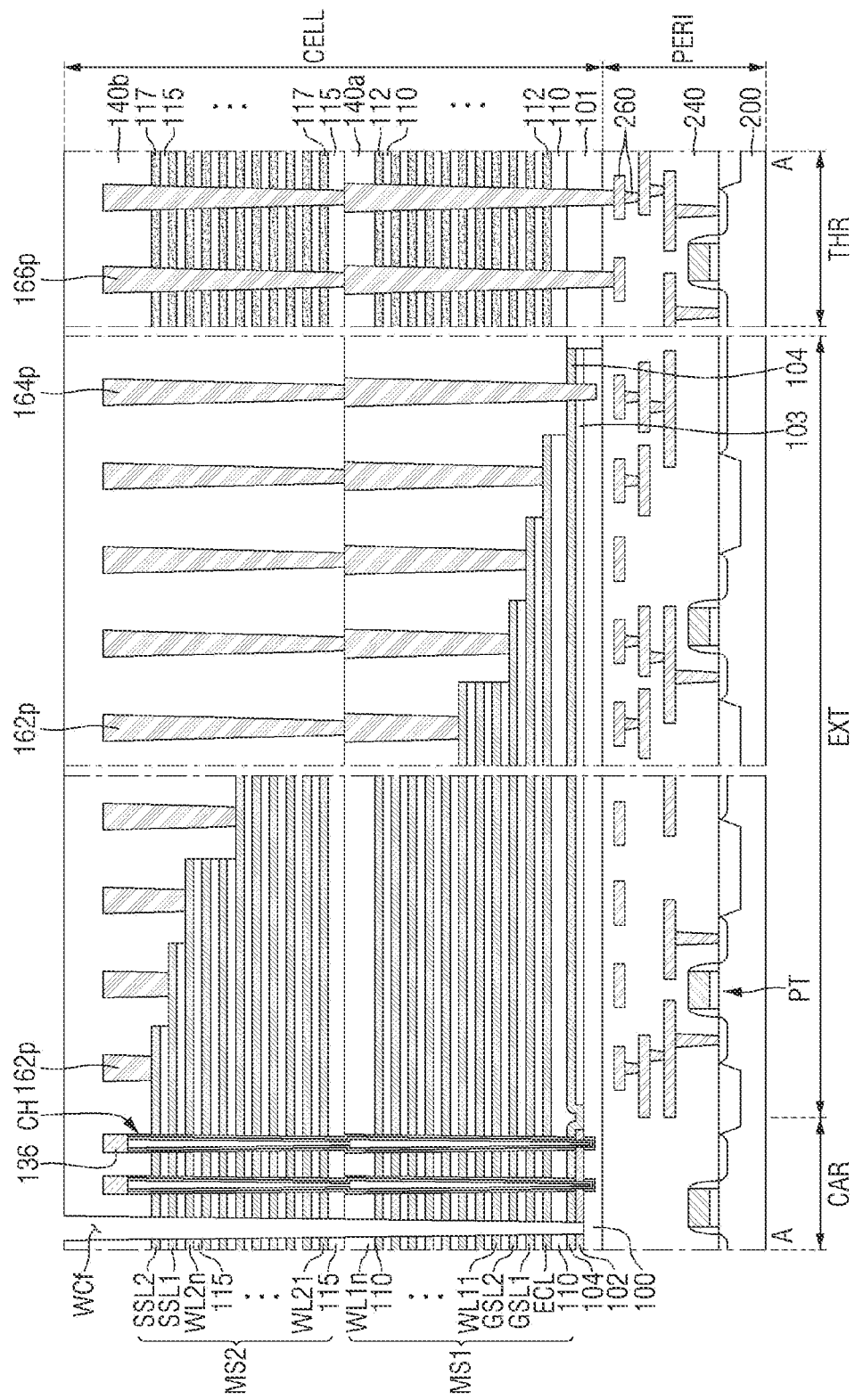
Figure 31:
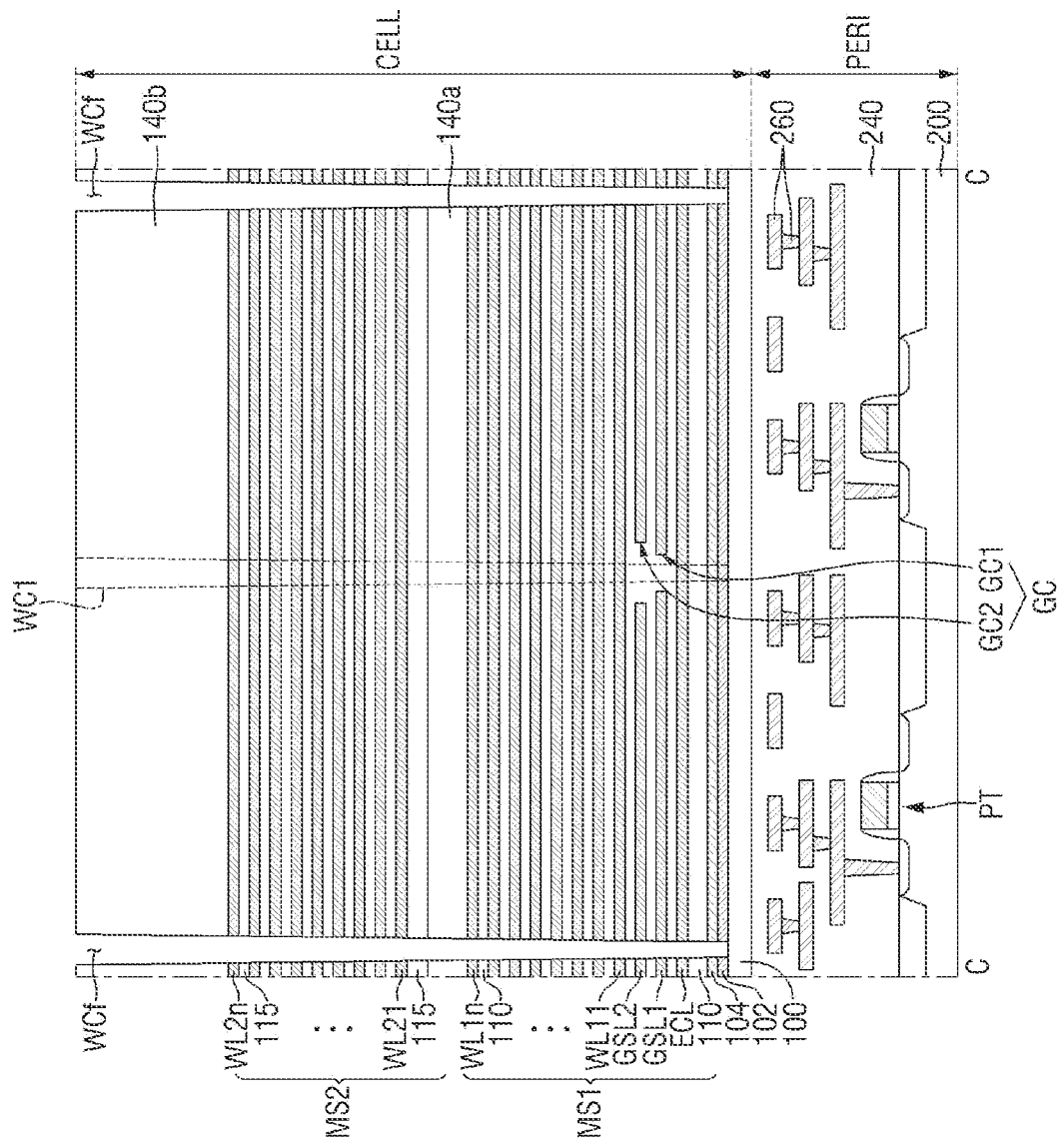

Referring to FIGS. 30 and 31, a plurality of gate electrodes ECL, GSL1, GSL2, WL11 to WL1*n*, WL21 to WL2*n*, SSL1 and SSL2 are formed.

For example, the mold sacrificial layers 112 and 117 may be removed using the block isolation region WCf, the first partial isolation region WC1 and the second partial isolation region WC2. The mold sacrificial layers 112 and 117 have an etch selectivity with respect to the mold insulating layers 110 and 115 and thus may be selectively removed. Subsequently, the gate electrodes ECL, GSL1, GSL2, WL11 to WL1*n*, WL21 to WL2*n*, SSL1 and SSL2 may be formed to replace the region from which the mold sacrificial layers 112 and 117 are removed.

As a portion of the first mold sacrificial layers 112 includes the aforementioned cutting opening GC, the ground selection lines GSL1 and GSL2 may also include a cutting opening GC. For example, the first ground selection line GSL1 may be replaced from the second sacrificial layer 112*b* to include a first cutting opening GC1, and the second ground selection line GSL2 may be replaced from the third sacrificial layer 112*c* to include a second cutting opening GC2.

In some embodiments, first source structures 102 and 104 may be formed. For example, the source sacrificial layer 103 may be selectively removed using the block isolation region WCf, the first partial isolation region WC1 and the second partial isolation region WC2. Subsequently, a first source layer 102 may be formed to replace the region from which the source sacrificial layer 103 is removed.

After the gate electrodes ECL, GSL1, GSL2, WL11 to WL1*n*, WL21 to WL2*n*, SSL1 and SSL2 and the first source structures 102 and 104 are formed, each of the block isolation region WCf, the partial isolation region WC1 and the second partial isolation region WC2 may be filled with an insulating material (e.g., silicon oxide).

Figure 32:
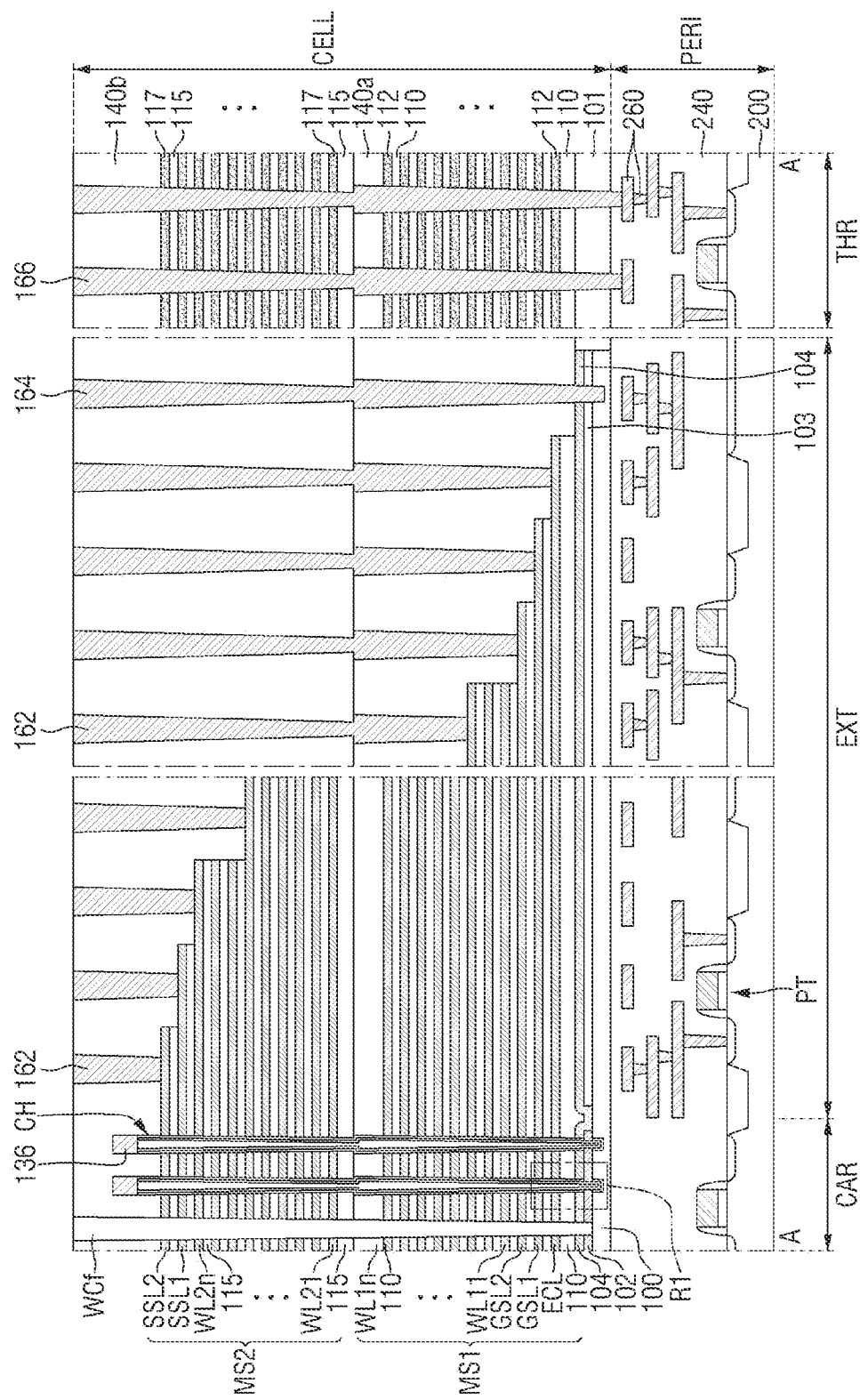

Referring to FIG. 32, a cell contact 162, a source contact 164 and a through via 166 are formed.

For example, the preliminary cell contact 162*p*, the preliminary source contact 164*p* and the preliminary through via 166*p* may be selectively removed. Subsequently, the cell contact 162, the source contact 164 and the through via 166 may be formed to replace the region from which the preliminary cell contact 162*p*, the preliminary source contact 164*p* and the preliminary through via 166*p* are removed.

Subsequently, referring to FIGS. 3 to 9, a first wiring structure 180 connected to the cell contact 162, the source contact 164 and the through via 166 is formed. As a result, the semiconductor memory device described with reference to FIGS. 3 to 9 may be fabricated.

Figure 33:
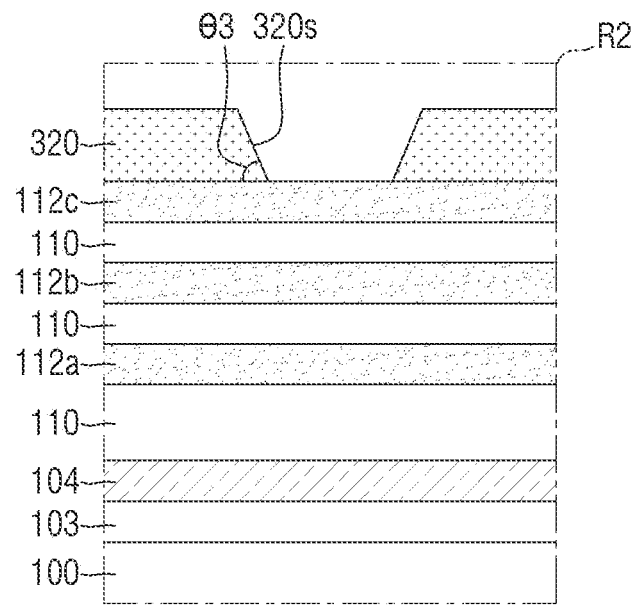
FIGS. 33 to 36 are views illustrating intermediate steps to describe a method for fabricating a semiconductor memory device according to some embodiments.

FIGS. 33 to 36 are views illustrating intermediate steps to describe a method for fabricating a semiconductor memory device according to some embodiments. For convenience of description, portions duplicated with those described with reference to FIGS. 1 to 32 will be described briefly or omitted. For reference, FIG. 33 is a view illustrating intermediate steps subsequent to FIG. 15.

Referring to FIG. 33, a second mask layer 320 is formed on the first mold sacrificial layer 112 and the first mold insulating layer 110.

The second mask layer 320 may be formed on the third sacrificial layer 112*c*. The second mask layer 320 may expose a region corresponding to the cutting opening GC described with reference to FIGS. 1 to 9. The second mask layer 320 may be, for example, a photoresist, but is not limited thereto.

The second mask layer 320 may include an inclined surface 320*s*. The inclined surface 320*s* may be defined by an opening of the second mask layer 320 corresponding to the cutting opening GC. The inclined surface 320*s* may form a third acute angle θ3 with an upper surface of the third sacrificial layer 112*c*.

Figure 34:
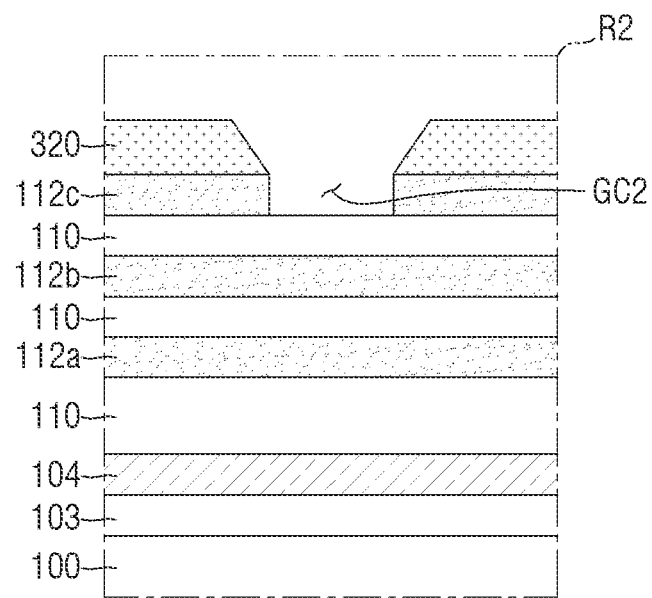
Figure 35:
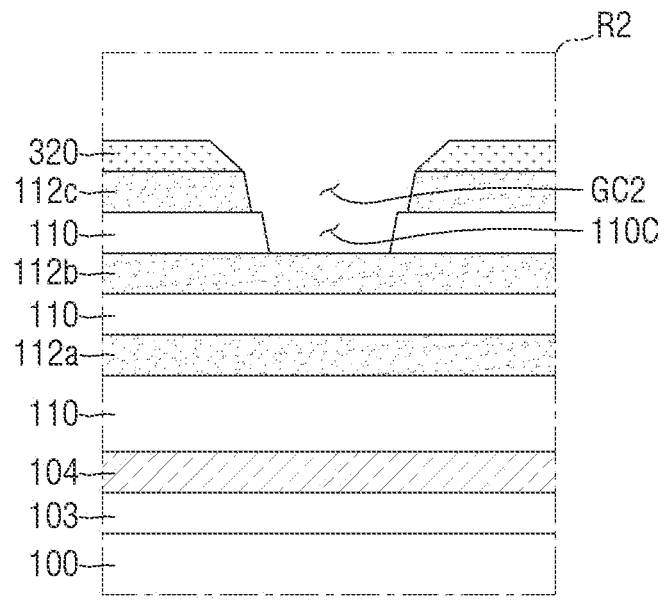
Figure 36:
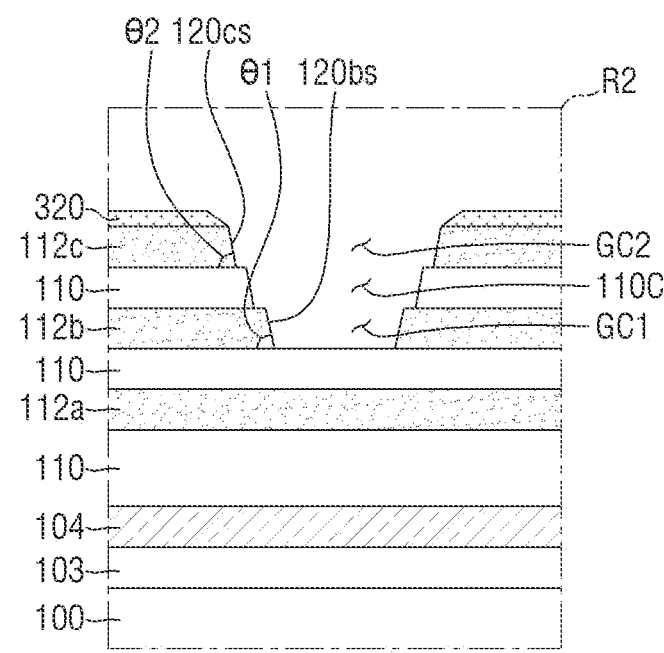

Referring to FIGS. 34 to 36, a fourth etching process using the second mask layer 320 as an etching mask is performed.

As the fourth etching process is performed, a first cutting opening GC1 may be formed in the second sacrificial layer 112*b*, a mold opening 110C may be formed in the first mold insulating layer 110, and a second cutting opening GC2 may be formed in the third sacrificial layer 112*c*.

After the fourth etching process is performed, a width of the first cutting opening GC1 may be narrower than that of the second cutting opening GC2 and that of the mold opening 110C. For example, a portion of the third sacrificial layer 112*c* exposed from the second mask layer 320 and a portion of the first mold insulating layer 110 may serve as etching masks in the fourth etching process. As a result, a cutting opening GC may be provided, which is increased in width as it becomes far away from the cell substrate 100.

In addition, after the fourth etching process is performed, each of the first and second cutting openings GC1 and GC2 may include an inclined side. In detail, as the second mask layer 320 includes the inclined surface 320*s*, a side of the first ground selection line GSL1 defined by the first cutting opening GC1 may form a first acute angle θ1 with a lower surface of the first ground selection line GSL1, and a side of the second ground selection line GSL2 defined by the second cutting opening GC2 may form a second acute angle θ2 with a lower surface of the second ground selection line GSL2.

Subsequently, the above-described steps may be performed using FIGS. 22 to 32 and FIGS. 3 to 9. As a result, the semiconductor memory device described with reference to FIG. 8B may be provided.

Figure 37:
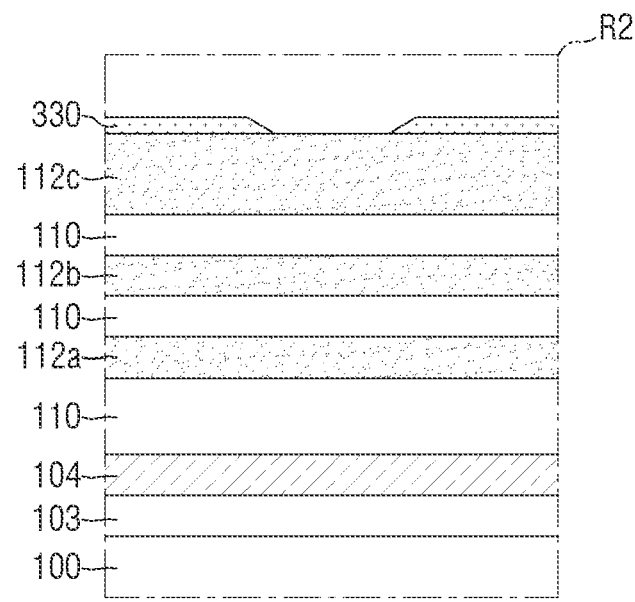
FIGS. 37 to 40 are views illustrating intermediate steps to describe a method for fabricating a semiconductor memory device according to some embodiments.

FIGS. 37 to 40 are views illustrating intermediate steps to describe a method for fabricating a semiconductor memory device according to some embodiments. For convenience of description, portions duplicated with those described with reference to FIGS. 1 to 32 will be described briefly or omitted. For reference, FIG. 37 is a view illustrating intermediate steps subsequent to FIG. 15.

Referring to FIG. 37, a third mask layer 330 is formed on the first mold sacrificial layer 112 and the first mold insulating layer 110.

The third mask layer 330 may be formed on the third sacrificial layer 112c. The third mask layer 330 may expose a region corresponding to the cutting opening GC described using FIGS. 1 to 9. The third mask layer 330 may be, for example, a photoresist, but is not limited thereto.

The third mask layer 330 may be formed to be relatively thin so that the third mask layer 330 may be removed in an etching process for forming the cutting opening GC.

Figure 38:
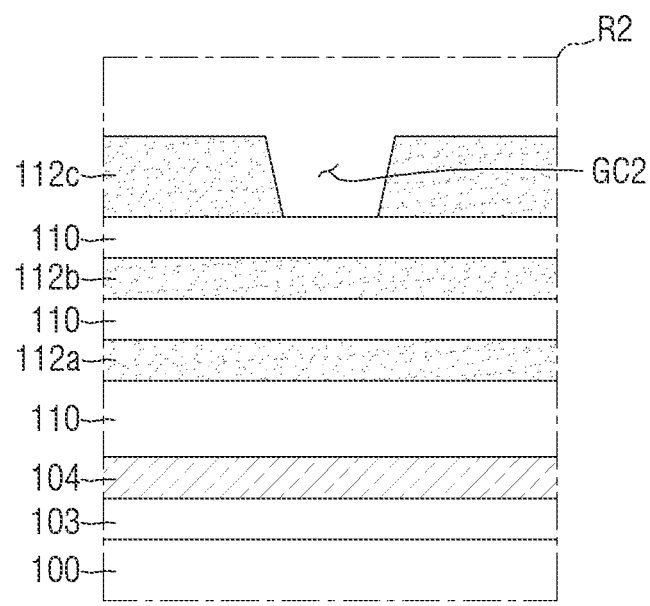
Figure 39:
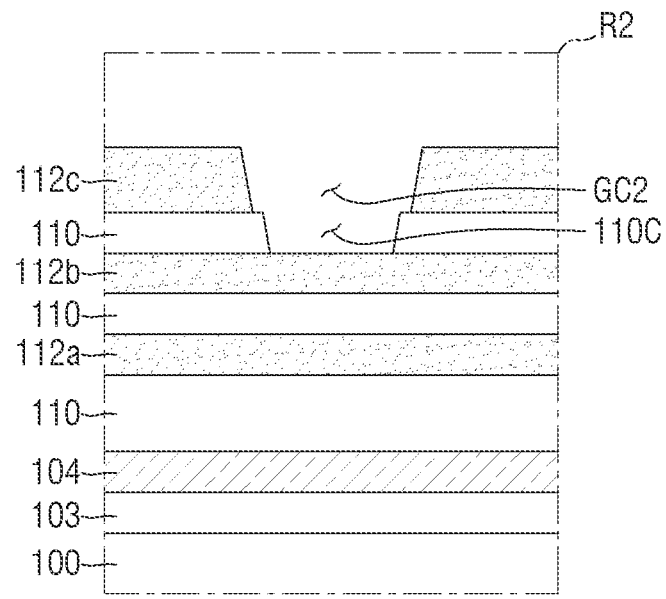
Figure 40:
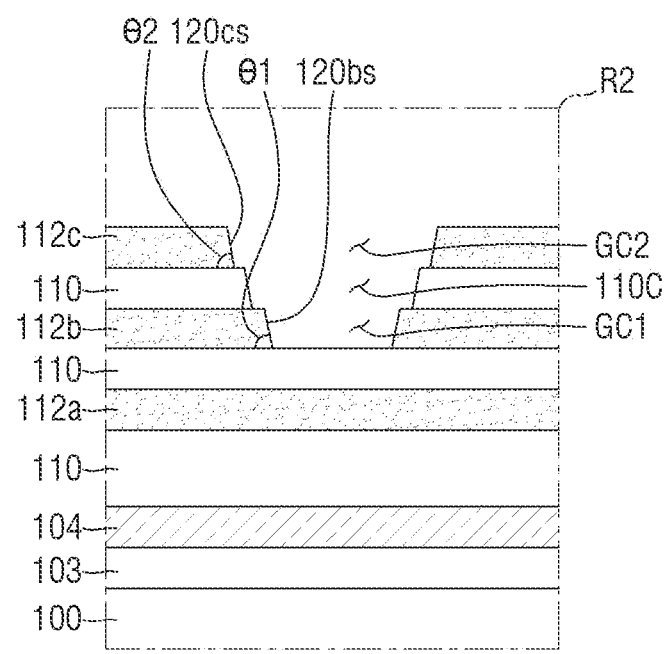

Referring to FIGS. 38 to 40, a fifth etching process is performed using the third mask layer 330 as an etching mask.

As the fifth etching process is performed, a first cutting opening GC1 may be formed in the second sacrificial layer 112b, a mold opening 110C may be formed in the first mold insulating layer 110, and a second cutting opening GC2 may be formed in the third sacrificial layer 112c.

After the fifth etching process is performed, a width of the first cutting opening GC1 may be narrower than that of the second cutting opening GC2 and that of the mold opening 110C. For example, as the third mask layer 330 is formed to be relatively thin, the third mask layer 330 may be removed during the process of forming the second cutting opening GC2. Subsequently, the third sacrificial layer 112c including the second cutting opening GC2 may also serve as an etching mask in the fifth etching process. As a result, a cutting opening GC may be provided, which is increased in width as it distance from the cell substrate 100 increases.

In addition, after the fifth etching process is performed, each of the first and second cutting openings GC1 and GC2 may include an inclined side. For example, as the third mask layer 330 includes an inclined surface, a side of the first ground selection line GSL1 defined by the first cutting opening GC1 may form a first acute angle θ1 with a lower surface of the first ground selection line GSL1, and a side of the second ground selection line GSL2 defined by the second cutting opening GC2 may form a second acute angle θ2 with a lower surface of the second ground selection line GSL2.

Subsequently, the above-described steps may be performed using FIGS. 22 to 32 and FIGS. 3 to 9. As a result, the semiconductor memory device described with reference to FIG. 8B may be provided.

Hereinafter, an electronic system including a semiconductor memory device according to example embodiments will be described with reference to FIGS. 1 to 13 and FIGS. 41 to 43.

Figure 41:
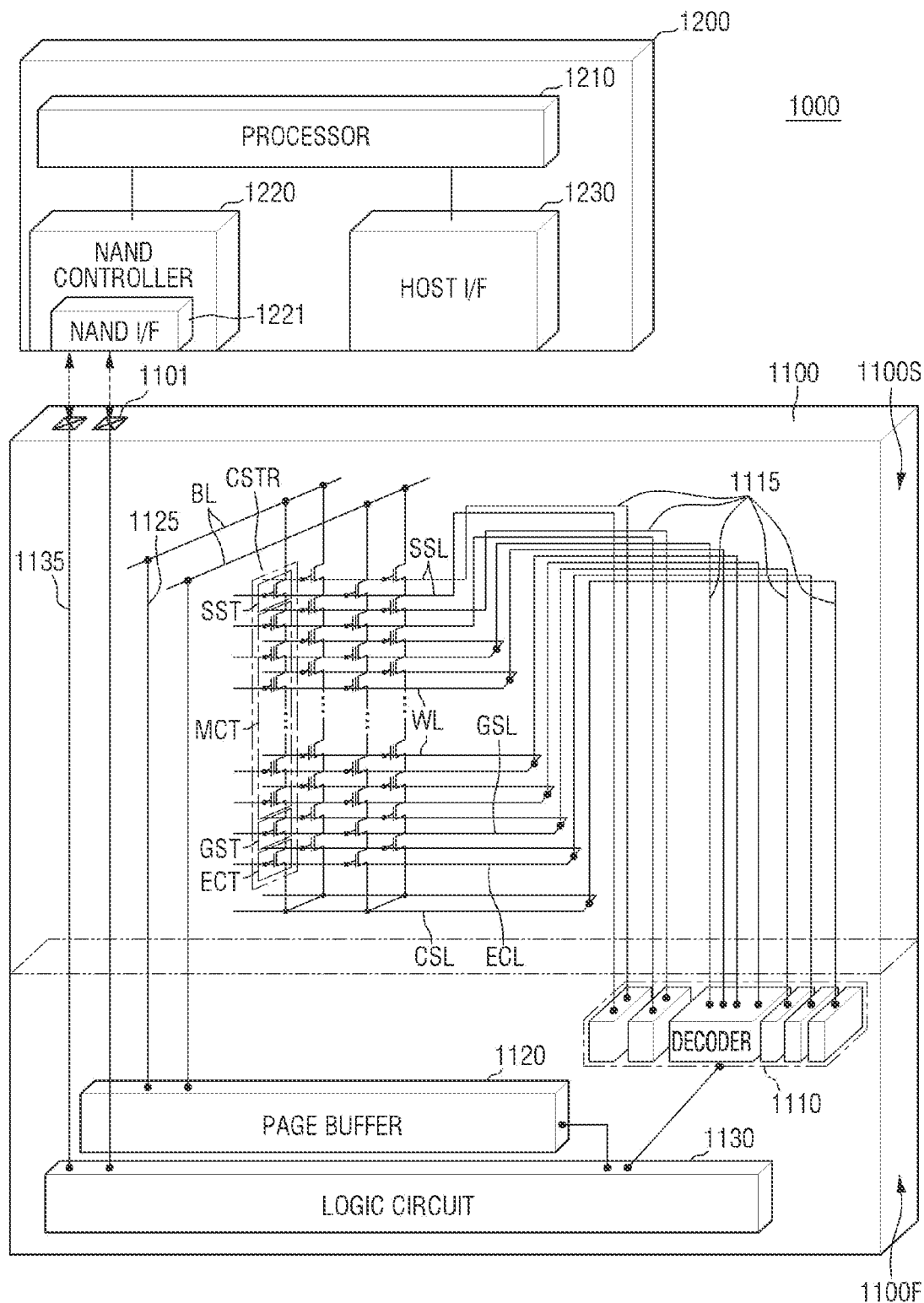
FIG. 41 is an example block diagram illustrating an electronic system according to some embodiments.
Figure 42:
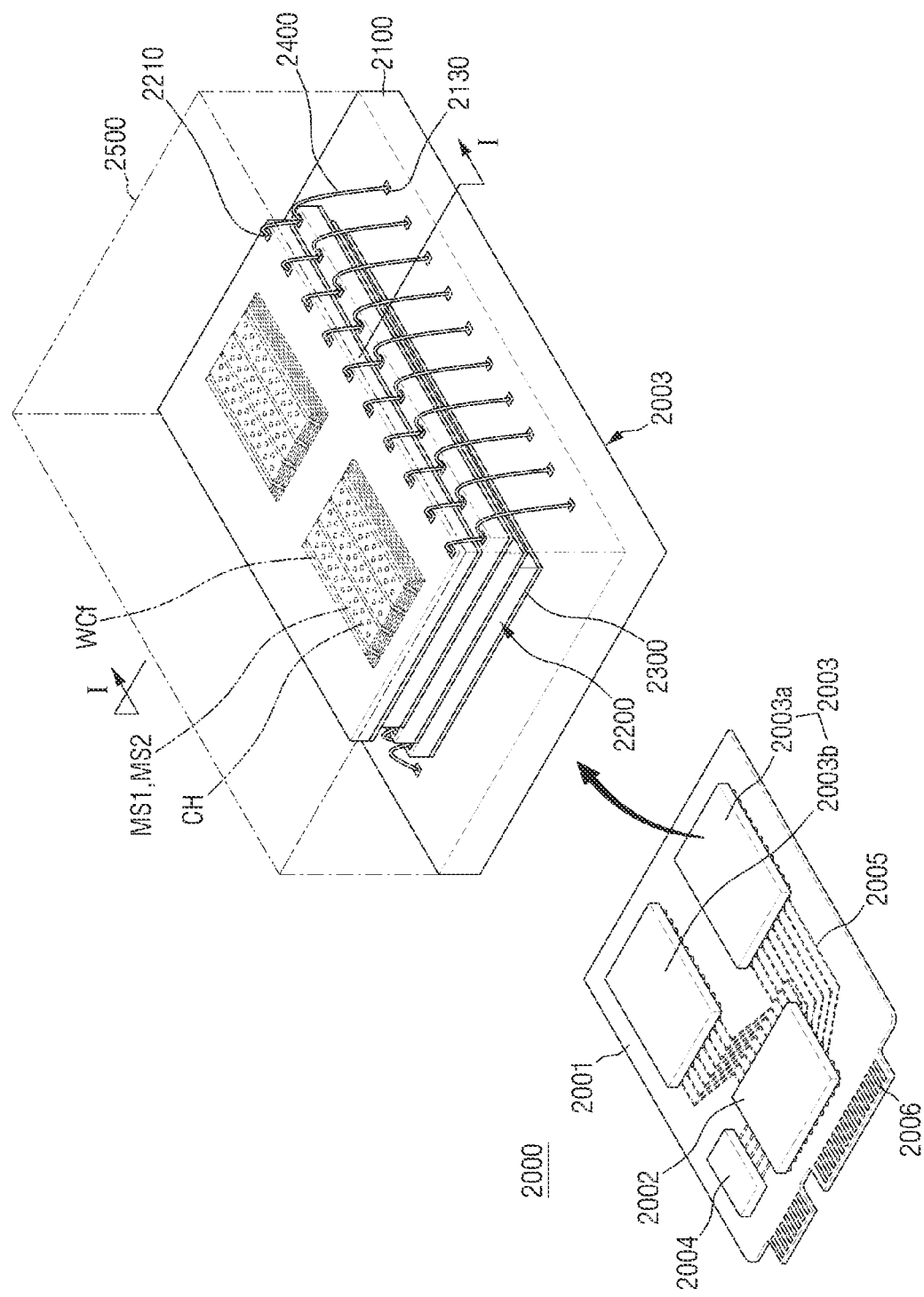
FIG. 42 is an example perspective view illustrating an electronic system according to some embodiments.

FIG. 41 is an example block diagram illustrating an electronic system according to some embodiments. FIG. 42 is an example perspective view illustrating an electronic system according to some embodiments. FIG. 43 is a schematic cross-sectional view taken along line I-I of FIG. 42. For convenience of description, portions duplicated with those described with reference to FIGS. 1 to 40 will be described briefly or omitted.

Referring to FIG. 41, an electronic system 1000 according to some embodiments may include a semiconductor memory device 1100 and a controller 1200 electrically connected to the semiconductor memory device 1100. The electronic system 1000 may be a storage device including one or a plurality of semiconductor memory devices 1100, or an electronic device including the storage device. For example, the electronic system 1000 may be a solid state drive (SSD) device including one or a plurality of semiconductor memory devices 1100, a Universal Serial Bus (USB), a computing system, a medical device, or a communication device.

The semiconductor memory device 1100 may be a non-volatile memory device (e.g., NAND flash memory device), and may be, for example, the semiconductor memory device described with reference to FIGS. 1 to 12. The semiconductor memory device 1100 may include a first structure 1100F and a second structure 1100S on the first structure 1100F.

The first structure 1100F may be a peripheral circuit structure that includes a decoder circuit 1110 (e.g., row decoder 33 of FIG. 1), a page buffer 1120 (e.g., page buffer 35 of FIG. 1) and a logic circuit 1130 (e.g., control logic 37 of FIG. 1).

The second structure 1100S may include a common source line CSL, a plurality of bit lines BL and a plurality of cell strings CSTR, which are described above with reference to FIG. 2. The cell strings CSTR may be connected to the decoder circuit 1110 through a word line WL, at least one string selection line SSL and at least one ground selection line GSL. In addition, the cell strings CSTR may be connected to the page buffer 1120 through the bit lines BL.

In some embodiments, the common source line CSL and the cell strings CSTR may be electrically connected to the decoder circuit 1110 through first connection lines 1115 extended from the first structure 1100F to the second structure 1100S. The first connection line 1115 may correspond to the through via 166 described with reference to FIGS. 1 to 12. That is, the through via 166 may electrically connect the respective gate electrodes ECL, GSL, WL and SSL with the decoder circuit 1110 (e.g., row decoder 33 of FIG. 1).

In some embodiments, the bit lines BL may be electrically connected to the page buffer 1120 through second connection lines 1125 extended from the first structure 1100F to the second structure 1100S. The second connection line 1125 may correspond to the through via 166 described with reference to FIGS. 1 to 12. That is, the through via 166 may electrically connect the bit lines BL with the page buffer 1120 (e.g., page buffer 35 of FIG. 1).

The semiconductor memory device 1100 may perform communication with the controller 1200 through an input/output pad 1101 electrically connected to the logic circuit 1130 (e.g., control logic 37 of FIG. 1). The input/output pad 1101 may be electrically connected to the logic circuit 1130 through an input/output connection line 1135 extended from the first structure 1100F to the second structure 1100S.

The controller 1200 may include a processor 1210, a NAND controller 1220 and a host interface 1230. In some embodiments, the electronic system 1000 may include a plurality of semiconductor memory devices 1100, and in this case, the controller 1200 may control the plurality of semiconductor memory devices 1100.

The processor 1210 may control the overall operation of the electronic system 1000 including the controller 1200.

The processor 1210 may operate in accordance with predetermined firmware, and may control the NAND controller 1220 to access the semiconductor memory device 1100. The NAND controller 1220 may include a NAND interface 1221 for processing communication with the semiconductor memory device 1100. A control command for controlling the semiconductor memory device 1100, data to be written in the memory cell transistors MCT of the semiconductor memory device 1100, data to be read from the memory cell transistors MCT of the semiconductor memory device 1100, etc. may be transmitted through the NAND interface 1221. The host interface 1230 may provide a communication function between the electronic system 1000 and an external host. When the control command is received from the external host through the host interface 1230, the processor 1210 may control the semiconductor memory device 1100 in response to the control command.

Referring to FIGS. 42 and 43, an electronic system according to some embodiments may include a main board 2001, a main controller 2002 packaged on the main board 2001, one or more semiconductor packages 2003, and a DRAM 2004. The semiconductor package 2003 and the DRAM 2004 may be connected to the main controller 2002 by wiring patterns 2005 formed in the main board 2001.

The main board 2001 may include a connector 2006 that includes a plurality of pins coupled to the external host. The number and arrangement of the plurality of pins in the connector 2006 may be varied depending on the communication interface between the electronic system 2000 and the external host. In some embodiments, the electronic system 2000 may perform communication with the external host in accordance with any one of interfaces such as a Universal Serial Bus (USB), a Peripheral Component Interconnect Express (PCI-Express), Serial Advanced Technology Attachment (SATA), and M-Phy for Universal Flash Storage (UFS). In some embodiments, the electronic system 2000 may operate by a power source supplied from the external host through the connector 2006. The electronic system 2000 may further include a power management integrated circuit (PMIC) that distributes the power source supplied from the external host to the main controller 2002 and the semiconductor package 2003.

The main controller 2002 may write data in the semiconductor package 2003 or read the data from the semiconductor package 2003, and may improve the operating speed of the electronic system 2000.

The DRAM 2004 may be a buffer memory for mitigating a speed difference between the semiconductor package 2003 that is a data storage space and the external host. The DRAM 2004 included in the electronic system 2000 may also operate as a kind of a cache memory, and may provide a space for temporarily storing data in a control operation for the semiconductor package 2003. When the DRAM 2004 is included in the electronic system 2000, the main controller 2002 may further include a DRAM controller for controlling the DRAM 2004, in addition to the NAND controller for controlling the semiconductor package 2003.

The semiconductor package 2003 may include a first semiconductor package 2003a and a second semiconductor package 2003b, which are spaced apart from each other. Each of the first semiconductor package 2003a and the second semiconductor package 2003b may be a semiconductor package that includes a plurality of semiconductor chips 2200. Each of the first semiconductor package 2003a and the second semiconductor package 2003b may include a package substrate 2100, semiconductor chips 2200 on the package substrate 2100, adhesive layers 2300 disposed on a lower surface of each of the semiconductor chips 2200, a connection structure 2400 for electrically connecting the semiconductor chips 2200 with the package substrate 2100, and a molding layer 2500 covering the semiconductor chips 2200 and the connection structure 2400 on the package substrate 2100.

The package substrate 2100 may be a printed circuit board that includes package upper pads 2130. Each semiconductor chip 2200 may include an input/output pad 2210. The input/output pad 2210 may correspond to the input/output pad 1101 of FIG. 41.

In some embodiments, the connection structure 2400 may be a bonding wire for electrically connecting the input/output pad 2210 with the package upper pads 2130. Therefore, in each of the first semiconductor package 2003a and the second semiconductor package 2003b, the semiconductor chips 2200 may be electrically connected to each other in a bonding wire manner, and may be electrically connected to the package upper pads 2130 of the package substrate 2100. In some embodiments, in each of the first semiconductor package 2003a and the second semiconductor package 2003b, the semiconductor chips 2200 may be electrically connected to each other by a connection structure that includes a through silicon via (TSV), instead of the connection structure 2400 of the bonding wire manner.

In some embodiments, the main controller 2002 and the semiconductor chips 2200 may be included in one package. In some embodiments, the main controller 2002 and the semiconductor chips 2200 may be packaged on a separate interposer substrate different from the main board 2001, and the main controller 2002 may be connected with the semiconductor chips 2200 by wiring formed on the interposer substrate.

In some embodiments, the package substrate 2100 may be a printed circuit board. The package substrate 2100 may include a package substrate body portion 2120, package upper pads 2130 disposed on an upper surface of the package substrate body portion 2120, lower pads 2125 disposed on a lower surface of the package substrate body portion 2120 or exposed through the lower surface, and internal wires 2135 electrically connecting the package upper pads 2130 with the lower pads 2125 inside the package substrate body portion 2120. The package upper pads 2130 may be electrically connected to the connection structures 2400. The lower pads 2125 may be connected to the wiring patterns 2005 of the main board 2001 of the electronic system 2000 through conductive connectors 2800 as shown in FIG. 42.

In the electronic system according to some embodiments, each of the semiconductor chips 2200 may include the semiconductor memory device described with reference to FIGS. 1 to 12. For example, each of the semiconductor chips 2200 may include a peripheral circuit region PERI and a memory cell region stacked on the peripheral circuit region PERI. Illustratively, the peripheral circuit region PERI may include the peripheral circuit board 200 and the second wiring structure 260, which are described with reference to FIGS. 3 to 7. Also, the memory cell region CELL may include the cell substrate 100, the mold structures MS1 the MS2, the channel structure CH, the block isolation region WCf, the first partial isolation region WC1, the cutting opening GC and the bit line BL, which are described with reference to FIGS. 3 to 9.

While the present inventive concept has been particularly shown and described with reference to example embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor memory device comprising:
a cell substrate;
a mold structure comprising a plurality of gate electrodes stacked on the cell substrate, the gate electrodes comprising a first ground selection line, a second ground selection line, and a plurality of word lines, which are sequentially stacked;
a channel structure that extends in a vertical direction, and penetrates the mold structure, the vertical direction crossing an upper surface of the cell substrate;
a partial isolation region that extends in a first direction that is parallel with the upper surface of the cell substrate and partially separates the mold structure; and
a ground isolation structure that connects two partial isolation regions adjacent to each other in the first direction, extends in the vertical direction, and penetrates the first ground selection line and the second ground selection line,
wherein a width of the ground isolation structure increases with distance from the cell substrate.

2. The semiconductor memory device of claim 1, wherein the partial isolation region and the ground isolation structure are alternately arranged along the first direction.

3. The semiconductor memory device of claim 1, wherein the ground isolation structure does not pass through the plurality of word lines.

4. The semiconductor memory device of claim 1,
wherein the ground isolation structure comprises a first insulating pattern that penetrates the first ground selection line and a second insulating pattern that penetrates the second ground selection line, and
wherein a width in the first direction of the second insulating pattern is greater than a width in the first direction of the first insulating pattern.

5. The semiconductor memory device of claim 1, wherein the ground isolation structure comprises a stepwise side.

6. The semiconductor memory device of claim 1,
wherein a side of the first ground selection line adjacent the ground isolation structure is at a first acute angle with a lower surface of the first ground selection line, and
wherein a side of the second ground selection line adjacent the ground isolation structure is at a second acute angle with a lower surface of the second ground selection line.

7. The semiconductor memory device of claim 6, wherein each of the first acute angle and the second acute angle is 85° or less.

8. The semiconductor memory device of claim 1, wherein the ground isolation structure comprises silicon oxide.

9. The semiconductor memory device of claim 1, further comprising:
a bit line that extends in a second direction, which is parallel with the upper surface of the cell substrate and intersects the first direction, and is connected to the channel structure.

10. A semiconductor memory device comprising:
a cell substrate;
a mold structure comprising mold insulating layers and gate electrodes, which are alternately stacked on the cell substrate, the gate electrodes comprising a first ground selection line, a second ground selection line, a plurality of word lines, and a string selection line, which are sequentially stacked;
a channel structure that intersects the respective gate electrodes and penetrates the mold structure;
a partial isolation region that extends in a first direction that is parallel with an upper surface of the cell substrate and partially separate the mold structure; and
a bit line that extends in a second direction, which is parallel with the upper surface of the cell substrate and intersects the first direction, and electrically connects to the channel structure,
wherein the mold structure comprises a first cell block and a second cell block, which are separated from each other by the partial isolation region, and a bridge region that connects the first cell block with the second cell block,
wherein the first ground selection line comprises a first cutting opening formed as the bridge region of the first ground selection line was removed,
wherein the second ground selection line comprises a second cutting opening formed as the bridge region of the second ground selection line was removed, and
wherein a size of the second cutting opening is greater than a size of the first cutting opening.

11. The semiconductor memory device of claim 10, wherein the second cutting opening encompasses the first cutting opening in a plan view.

12. The semiconductor memory device of claim 10, wherein each of the word lines is electrically connected along the first cell block, the bridge region and the second cell block.

13. The semiconductor memory device of claim 10, further comprising a ground isolation structure in the first cutting opening and the second cutting opening.

14. The semiconductor memory device of claim 10, wherein the partial isolation region and the bridge region are alternately arranged along the first direction.

15. The semiconductor memory device of claim 10,
wherein a side of the first ground selection line adjacent the first cutting opening forms a first acute angle with a lower surface of the first ground selection line, and
wherein a side of the second ground selection line adjacent the second cutting opening forms a second acute angle with a lower surface of the second ground selection line.

16. The semiconductor memory device of claim 15, wherein each of the first acute angle and the second acute angle is 85° or less.

17. The semiconductor memory device of claim 10, further comprising:
a peripheral circuit board;
a peripheral circuit element on the peripheral circuit board;
an interconnection insulating layer on the peripheral circuit element; and
a wiring structure in the interconnection insulating layer,
wherein the cell substrate is stacked on the interconnection insulating layer.

18. An electronic system comprising:
a main board;
a semiconductor memory device on the main board; and
a controller electrically connected with the semiconductor memory device on the main board, wherein the semiconductor memory device includes:
- a cell substrate;
- a mold structure comprising a plurality of gate electrodes stacked on the cell substrate and respectively connected with the controller;
- a channel structure that extends in a vertical direction and penetrates the mold structure, the vertical direction crossing an upper surface of the cell substrate;
- a partial isolation region that extends in a first direction and partially separate the mold structure; and
- a bit line that extends in a second direction that intersects the first direction, and connects the channel structure with the controller, wherein the mold structure comprises a first cell block and a second cell block, which are separated from each other by the partial isolation region, and a bridge region that connects the first cell block with the second cell block, wherein the gate electrodes comprise a first ground selection line, a second ground selection line, and a plurality of word lines, which are sequentially stacked, wherein the first ground selection line comprises a first cutting opening formed as the bridge region of the first ground selection line was removed, and wherein the second ground selection line comprises a second cutting opening formed as the bridge region of the second ground selection line was removed, and wherein a size of the second cutting opening is greater than a size of the first cutting opening.

19. The electronic system of claim 18, wherein the controller is configured to separately control the first ground selection line of the first cell block and the first ground selection line of the second cell block, and separately control the second ground selection line of the first cell block and the second ground selection line of the second cell block.

20. The electronic system of claim 18, wherein the semiconductor memory device further comprises a ground isolation structure in the first cutting opening and the second cutting opening.

* * * * *